(12) United States Patent
Müller et al.

(10) Patent No.: US 10,448,500 B2
(45) Date of Patent: Oct. 15, 2019

(54) HF COMBINER FOR A MOBILE RADIO SITE, HF COMBINER ARRANGEMENT HAVING TWO HF COMBINERS FOR A MOBILE RADIO SITE, AND SUCH A MOBILE RADIO SITE

(71) Applicant: KATHREIN SE, Rosenheim (DE)

(72) Inventors: Kai-Uwe Müller, Ainring (DE); Joao Lopes, Stuttgart (DE); Bernhard Sieben, Neufahrn in Niederbayern (DE)

(73) Assignee: Kathrein SE, Rosenheim (DE)

( * ) Notice: Subject to any disclaimer, the term of this patent is extended or adjusted under 35 U.S.C. 154(b) by 0 days.

(21) Appl. No.: 16/260,911

(22) Filed: Jan. 29, 2019

(65) Prior Publication Data

US 2019/0239341 A1 Aug. 1, 2019

(30) Foreign Application Priority Data

Jan. 30, 2018 (DE) ........................ 10 2018 102 056

(51) Int. Cl.
| | |
|---|---|
| *H05K 1/02* | (2006.01) |
| *H04B 1/00* | (2006.01) |
| *H05K 1/18* | (2006.01) |
| *H05K 7/14* | (2006.01) |
| *H05K 9/00* | (2006.01) |

(52) U.S. Cl.
CPC .......... *H05K 1/0243* (2013.01); *H04B 1/006* (2013.01); *H05K 1/181* (2013.01); *H05K 7/1427* (2013.01); *H05K 9/002* (2013.01)

(58) Field of Classification Search
CPC ...... H03F 3/189; H05K 1/0243; H05K 1/181; H05K 7/1427; H05K 9/002; H04B 1/006
See application file for complete search history.

(56) References Cited

U.S. PATENT DOCUMENTS

| | | | | |
|---|---|---|---|---|
| 5,926,466 A | * | 7/1999 | Ishida | ................. H01P 1/20345 370/280 |
| 2005/0064830 A1 | * | 3/2005 | Grigore | .................... H03C 5/00 455/127.4 |
| 2008/0157899 A1 | * | 7/2008 | Weitzenberger | ...... H01P 1/2053 333/134 |
| 2011/0279180 A1 | * | 11/2011 | Yamanouchi | ......... H03F 1/0227 330/207 R |

(Continued)

FOREIGN PATENT DOCUMENTS

DE 10 2015 011 182 3/2017

*Primary Examiner* — Nizar N Sivji
(74) *Attorney, Agent, or Firm* — Nixon & Vanderhye P.C.

(57) ABSTRACT

An HF combiner includes a housing having a common terminal and n signal line terminals. The n signal line terminals are coupled to the common terminal within the housing via one of n filter paths in each case. A circuit board arrangement is used for outcoupling and separately transmitting low-frequency signals, and includes a common terminal contact and n signal line terminal contacts. Each of the n signal line terminal contacts is electrically connected or connectable to the common terminal contact via one of n bypass lines in each case. For this purpose, a control device controls n signal line switching devices. When an AISG signal is detected at one of the n signal line terminal contacts, the control device is designed to electrically connect the particular one of the n signal line terminal contacts, at which the AISG signal has been detected, to the common terminal contact.

20 Claims, 11 Drawing Sheets

(56) References Cited

U.S. PATENT DOCUMENTS

| | | | | |
|---|---|---|---|---|
| 2013/0271243 A1* | 10/2013 | Haunberger | .............. | H01P 7/04 333/207 |
| 2015/0303879 A1* | 10/2015 | Murao | ....................... | H03F 3/68 330/295 |
| 2017/0047898 A1* | 2/2017 | Otsuka | ....................... | H03F 1/32 |
| 2017/0257207 A1* | 9/2017 | Kim | ....................... | H04B 7/155 |

\* cited by examiner

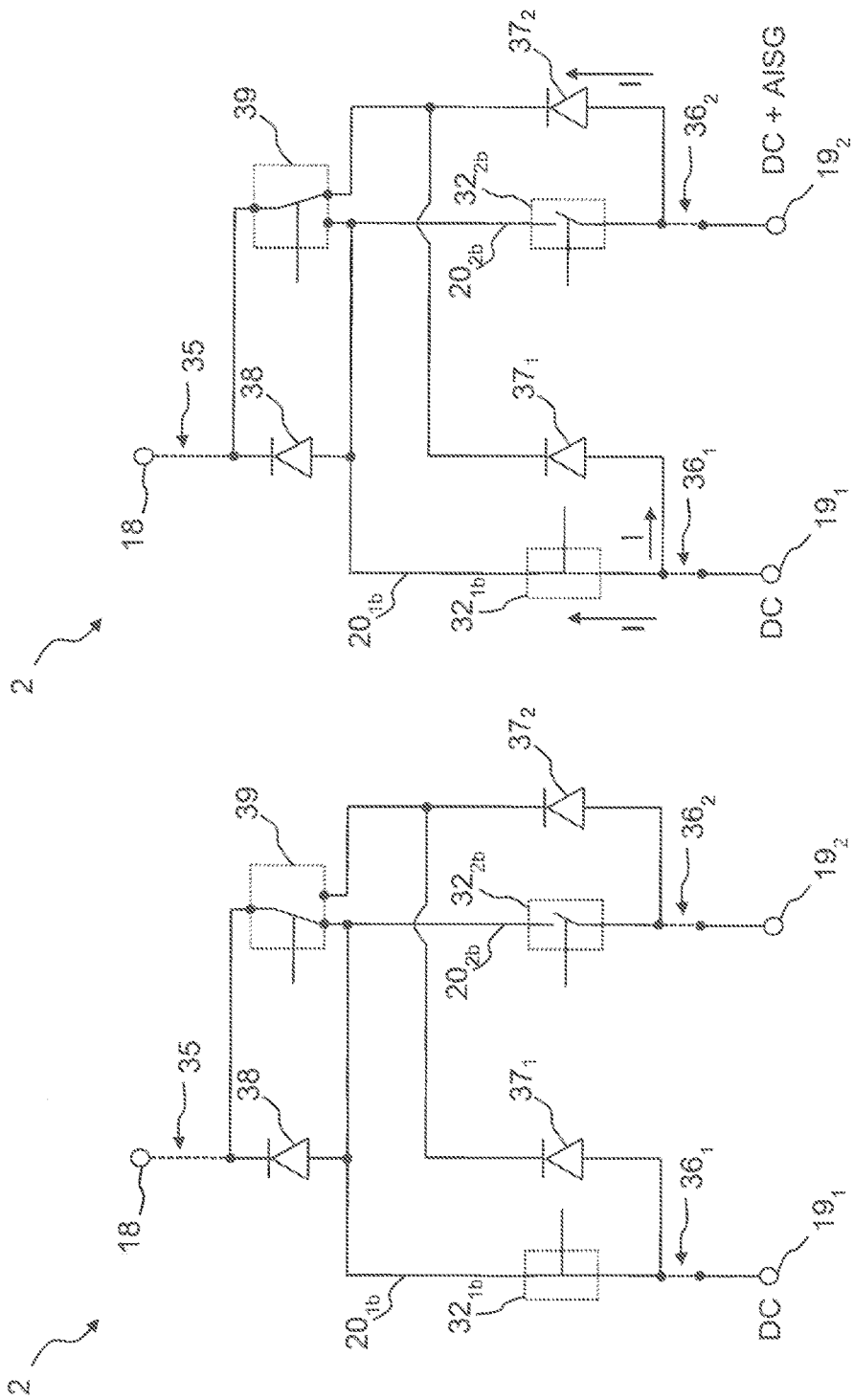

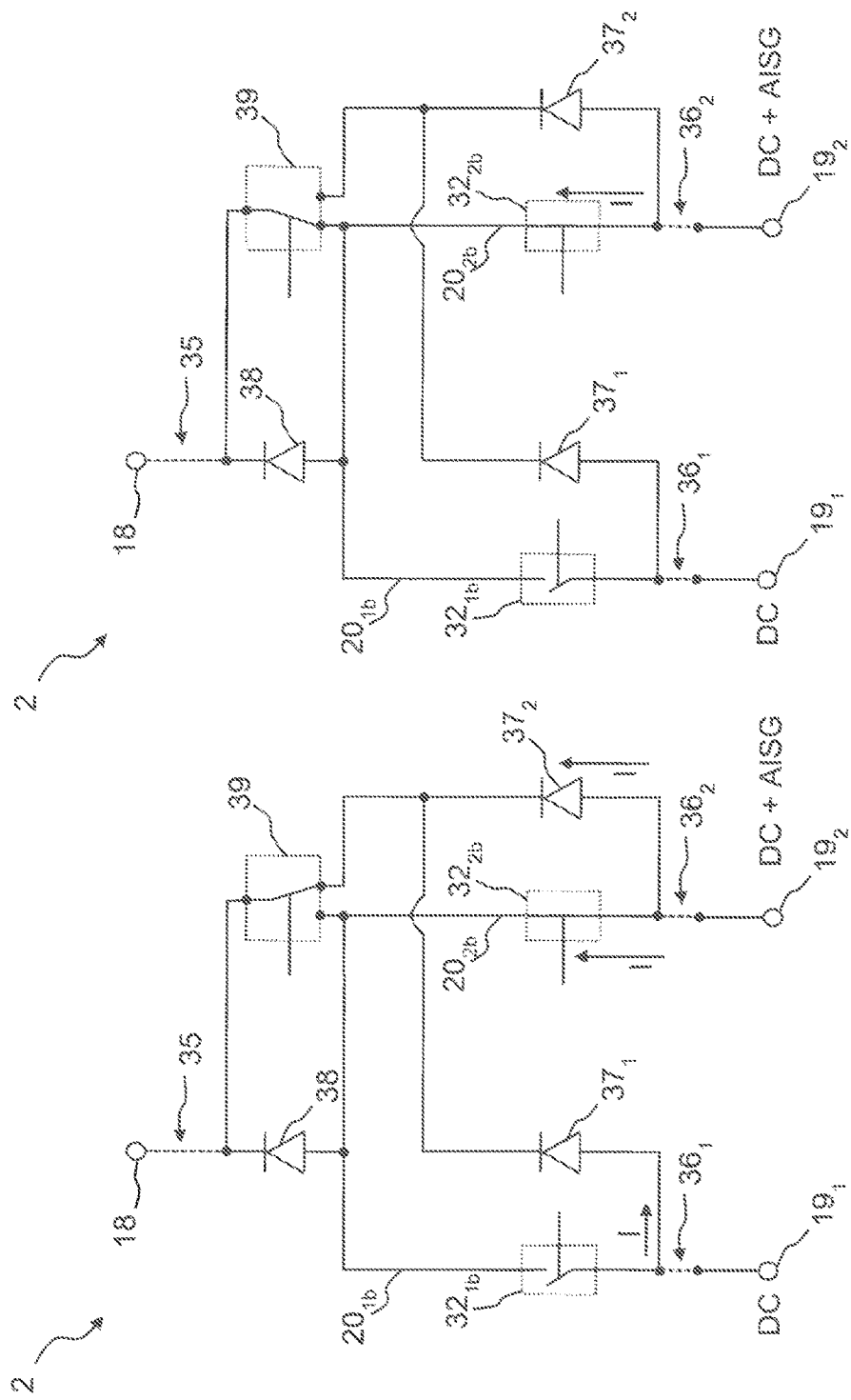

HF COMBINER FOR A MOBILE RADIO SITE, HF COMBINER ARRANGEMENT HAVING TWO HF COMBINERS FOR A MOBILE RADIO SITE, AND SUCH A MOBILE RADIO SITE

CROSS-REFERENCE TO RELATED APPLICATION

This application claims priority to DE Patent Application No. 10 2018 102 056.2 filed Jan. 30, 2018, the entire contents of which are hereby incorporated by reference.

FIELD

The technology herein relates to an HF combiner, which may also be referred to as a mobile radio combiner, and which may be used for setting up a mobile radio site. The technology herein further relates to an HF combiner arrangement having two such HF combiners, and to a corresponding mobile radio site in which at least two HF combiners or at least one HF combiner arrangement are/is used.

BACKGROUND AND SUMMARY

HF combiners are used to combine mobile radio signals from different mobile radio bands, i.e. having different frequency ranges, to allow the mobile radio signals to be transmitted to an antenna mast via a shared cable to the antennas. A cable, also referred to as a feeder cable, is costly to manufacture due to the fact that it must have very good electrical properties (for example, with regard to dielectric losses). For this reason, attempts are made to transmit as many different mobile radio bands as possible via one feeder cable. Such a combination, or separation of mobile radio bands, is achieved using HF combiners. An HF combiner includes multiple signal line terminals that are connected to the various base stations. A base station receives a digital data stream, conditions it, and outputs it in an HF signal. The HF combiner combines HF signals of different frequencies from various base stations, and outputs them to a common terminal to which one end of the feeder cable is connected. The electrical functional units are connected at the other end of the feeder cable. The term "electrical functional units" is understood to mean not only the antennas themselves, but often also other components such as phase shifters, remote electrical tilt (RET) units, and dual tower mounted amplifiers (DTMAs). To allow operation and control of these further components of the electrical functional units, the particular base station also outputs a supply voltage (DC signal) and control signals (AISG signals). These antenna interface standard group (AISG) signals are transmitted at a frequency of 2.176 MHz, using an on/off keying method. Data rates of 9.6 kbps, 38.4 kbps, or 115.2 kbps, for example, may thus be achieved. The bandwidth of an AISG signal is preferably 200 kHz or less. The level of the on/off keying signal is +5 dBm (on signal), for example, and −40 dBm (off signal), for example.

Different filter paths are used in order for the HF combiners used to be able to transmit different mobile radio bands (different frequency ranges) at the individual signal line terminals to a common terminal to which the feeder cable is connected. This also ensures that signals that are received from a feeder cable are output to the correct signal line terminals. The signals to be sent from the base station may be transmitted via the same feeder cable that also transmits the signals to be received by the base station. However, different feeder cables, and thus different combiners, may also be used here for uplink and downlink. The filter paths are implemented in particular as band-pass filters, for which reason a DC signal and an AISG signal, which are necessary for controlling the above-mentioned electrical functional units, cannot be transmitted via these filter paths. For this reason, there are bypass lines that run outside the filter paths. The DC signal and the AISG signal are transmitted via these bypass lines. The bypass lines are outcoupled at the signal line terminals and coupled back in at the common terminal. Low-pass filters are provided here so that the particular HF signals of the mobile radio bands are also not outcoupled.

A base station has in particular two terminals. The MAIN signal is output or received at one terminal, and the DIV signal is output or received at another terminal. Both signals are phase-shifted by 90°, and are output or received, for example, by different dipoles of a vector dipole or dipole square. The frequency range is the same. However, the base station outputs an AISG signal at only one of the terminals.

In previous HF combiners from the prior art, individual signal line terminals are fixedly connected to the common terminal via bypass lines. In this case, DC signals and AISG signals can be transmitted only from a signal line terminal to the common terminal. Since a signal line terminal, due to the filter path to which it is connected, is used for connecting only one mobile radio band, various HF combiners are necessary to be able to transmit the AISG signals from each base station, via the feeder cable, to the electrical functional units to be controlled. This complicates manufacture of the HF combiners, and there is always the risk that faulty cabling will occur in setting up a mobile radio site, and the mobile radio site cannot be placed in operation.

In principle, consideration could be given to connecting the particular signal line, in which a DC signal is initially present, to the common terminal via a corresponding low-frequency outcoupling. However, here as well the problem would arise that for the case that the base stations are operational in a different time sequence and output a DC signal in a different time sequence, the interconnection of the signal line terminal to the common terminal would be faulty. In this case, the HF combiner also would no longer correct this interconnection when an AISG signal from another base station, which is not allowed until later, is then suddenly present at a different signal line terminal.

Aspects of the present technology, therefore, provide an HF combiner that is suitable for setting up a mobile radio site, even though MAIN signals or DIV signals from different base stations are present at its signal line terminals, and the particular signal line terminal at which an AISG signal is present is not defined beforehand.

The object is achieved by an HF combiner, by an HF combiner arrangement, and by a mobile radio site. Refinements of the HF combiner and refinements of the HF combiner arrangement are also contemplated.

The HF combiner according to example non-limiting embodiments includes a housing on which a common terminal and n signal line terminals (where n≥2) are situated. The n signal line terminals are connected and/or coupled to the common terminal within the housing via one of n filter paths in each case. The filter paths are in particular band-pass filters via which the mobile radio signals may be transmitted from the particular signal line terminal to the common terminal, or from the common terminal to the particular signal line terminal. In addition, a circuit board arrangement is provided. The circuit board arrangement is used for transmitting the outcoupled low-frequency signals (DC signal and AISG signal). For this purpose, the circuit board arrangement has a common terminal contact that is galvanically connected to the common terminal via a low-pass filter. In addition, the circuit board arrangement has n signal line terminal contacts, each of the n signal line terminal contacts being galvanically connected to the particular signal line terminal via a low-pass filter. In the simplest case, the terminal contacts are soldering points or plugs on the circuit board arrangement. The n signal line terminal contacts are hereby connected or connectable to the common terminal contact via n bypass lines. These bypass lines converge at the common terminal contact. Furthermore, there is an electronics unit that has a control device, a detector device, and at least n signal line switching devices. Each of these signal line switching devices includes a first switching unit. One of these switching units is situated in each of the n bypass lines, the switching units upon actuation being designed to disconnect or connect the particular surroundings line, in the latter case the signal line terminal contact in question being electrically connected to the common terminal contact. An AISG signal, which is present at the signal line terminal contact in question, is then transmitted to the common terminal contact. The transmission takes place in a conversion-free manner. This means that the AISG signal is not converted via additional modems (signal converters) into a different protocol. The bypass line for transmitting the AISG signal between the signal line terminal contact in question and the common terminal contact is therefore modem-free. The transmission takes place in this case preferably in a completely passive manner. This means that the signal is not changed, i.e. not amplified, for example. The connection between the signal line terminal contact in question and the common terminal contact is preferably low resistance. The detector device, which preferably includes n signal line detector devices, is connected or coupled either to the particular signal line terminal contact, or in each case between one of the n signal line terminals and the first switching unit. The detector device, in a BTS operating state, is designed to detect whether an AISG signal is present at one of the n signal line terminal contacts. For such a detection, the control device or the detector device is designed to control the first switching unit in the particular one of the n bypass lines in such a way that the first switching unit electrically connects the particular one of the n signal line terminal contacts, at which the AISG signal has been detected, to the common terminal contact. The AISG signal (low resistance) is transmitted from the signal line terminal contact in question to the common terminal contact by means of this electrical connection.

It is particularly advantageous that a detector device is provided with which an AISG signal can be detected at one of the n signal line terminal contacts. This result is then used to relay this AISG signal via the particular first switching unit to the common terminal contact, so that the signal is available at the common terminal. In this case, it does not matter whether the AISG signal is supplied to the first or second or third signal line terminal of the HF combiner. A BTS operating state is understood to mean that the HF combiner is connected to the base stations. The particular signal line terminals are therefore (at least indirectly) connected to the connections of the base stations, whereas the common terminal is connected to the feeder cable. The HF combiner is therefore situated "on the base" and not "on top of the antenna mast."

A combiner having bypass lines is also disclosed in US 2017/257207 A1 and is connected to corresponding ports. A "bias tee" separates each of the bypass lines into an AISG line and a DC line, only AISG signals being transmitted via the AISG line and only DC signals via the DC line. In contrast to the solution according to example non-limiting embodiments, in which the detector device detects an AISG signal, in this case only detection of a DC signal takes place. If a DC signal is detected, the DC line is connected to the common terminal. In contrast, the AISG line associated with the same port is not connected electrically to the common terminal, as in the solution according to example non-limiting embodiments, but is galvanically separated by two modems. A first modem converts the AISG signal on the AISG line, which modem comprises an OOK modulation (on-off keying), into a TTL signal. The second modem converts the TTL signal back into an AISG signal and outputs it at the common terminal. The use of such modems means that no electrical connection is established for transmitting the AISG signal between the respective port and the common terminal.

The detector device can detect the presence of an AISG signal via a galvanic connection or via a (capacitive or inductive) coupling. This is described by the wording "connected" or "coupled."

In one preferred embodiment of the HF combiner according to example non-limiting embodiments, the detector device is additionally connected or coupled either to the common terminal contact or between the common terminal and the n signal line switching devices. The detector device preferably has a common detector device. The detector device is designed to detect whether a DC signal is present at one of the n signal line terminal contacts. The detector device is also designed to detect whether a DC signal is present at the common terminal contact. When the control device is started, i.e. in particular when it is first supplied with power following a de-energised state, it assumes a starting operating state. From this starting operating state the control device may switch either into the BTS operating state or into an ANT operating state. In the BTS operating state, the control device changes over when the detector device detects a DC signal at one of the n signal line terminal contacts. In contrast, the control device changes over to the ANT operating state when the detector device detects a DC signal at the common terminal contact. The HF combiner according to example non-limiting embodiments may thus be universally used. It independently detects whether it is situated at the base stations, or on top of the antenna mast for the electrical functional units. Thus, only one HF combiner is necessary, which independently detects its particular location and purpose of use and appropriately adjusts its functionality. The ANT operating state is understood to mean that the HF combiner is connected to the electrical functional units. The particular signal line terminals are therefore directly connected, for example, to the connections of the antennas. An indirect connection may result from connecting the signal line terminals to the connections of single-band DTMAs or dual-band DTMAs, which in turn are connected to the antennas. The common terminal is hereby connected to the feeder cable. The HF combiner is therefore situated "on the antenna mast" and not "below on the base stations".

As discussed at the outset, the base stations include at least two terminals. In a first terminal the MAIN signal is output or received, and in a second terminal the DIV signal is output or received. Both signals are present in the same frequency range, but phase-shifted by 90° relative to one another. For this reason, the two signals cannot be transmitted via the same feeder cable. Therefore, at least two HF combiners are required, which are connected to different feeder cables. Due to the corresponding transmission power outputs, these HF combiners preferably have a cavity design. The housing includes a housing base, the circuit board arrangement spaced apart from the housing base, and a circumferential housing wall between the housing base and the circuit board arrangement, thus delimiting a corresponding receiving space. For each filter path, at least one resonator inner conductor is provided that is galvanically connected to the housing base of the housing and extends in the axial direction from the housing base in the direction of the circuit board arrangement, and ends at a distance from the circuit board arrangement and/or is galvanically separated therefrom. The individual filter paths in which at least one resonator inner conductor is situated in each case are separated (decoupled), at least partially, from one another by a wall that is galvanically connected to the housing and extends in the direction of the circuit board arrangement and preferably is likewise galvanically connected thereto. Such a housing is preferably manufactured in an (aluminium) (pressure) casting process. Alternatively or additionally, a milling process may also be used. The individual HF combiners are then also closed with a cover assembly.

Since the MAIN signal and the DIV signal of a base station must be transmitted via two different HF combiners, in one refinement according to example non-limiting embodiments an HF combiner arrangement is described. This HF combiner arrangement includes a first and a second HF combiner having a cavity design. To reduce costs, according to example non-limiting embodiments the use of such housing covers has been dispensed with. The first and the second HF combiner are placed one on top of the other, wherein the circuit board arrangement electrically or electromagnetically separates the receiving space of the first HF combiner from the receiving space of the second HF combiner, and conversely. In particular, the end-face sides of the housing walls of the two HF combiners rest one on top of the other, wherein the circuit board arrangement separates the respective receiving spaces from one another. In this way an HF combiner arrangement may be provided in a particularly cost-effective manner, and in each case has n signal line terminals for the MAIN signal from n mobile radio bands, and n signal line terminals for the DIV signal from n mobile radio bands. On the other hand, there are two common terminals for connecting two feeder cables, which in turn are connected to the electrical functional units on the antenna mast. A design using strip conductor technology or microstrip conductor technology would also be possible.

The HF combiner according to example non-limiting embodiments and the HF combiner arrangement according to example non-limiting embodiments are used in mobile radio sites. A mobile radio site is understood to mean the combination of base stations, HF combiners, feeder cables, and electrical functional units (DB-DTMA, for example), in addition to the actual antenna elements on the antenna mast. Such a mobile radio site preferably includes at least two of the HF combiners according to example non-limiting embodiments or at least one of the HF combiner arrangements according to example non-limiting embodiments. In addition, n base stations are provided which are operable in different mobile radio bands. For example, different mobile radio standards (LTE, UMTS, GSM, for example) may also be used. Each of the n base stations includes at least two signal terminals, the n base stations being designed for transmitting and/or receiving a MAIN signal at a first signal terminal, and the n base stations being designed for transmitting and/or receiving a DIV signal at a second signal terminal. The first signal terminals of the n base stations are electrically connected to the n signal line terminals of the first HF combiner or of the first HF combiner of the first HF combiner arrangement. On the other hand, the second signal terminals of the n base stations are electrically connected to the n signal line terminals of the second HF combiner or of the second HF combiner of the first HF combiner arrangement. A first feeder cable at its first end is electrically connected to the common terminal of the first HF combiner or to the common terminal of the first HF combiner of the first HF combiner arrangement. A second feeder cable at its first end is electrically connected to the common terminal of the second HF combiner or to the common terminal of the second HF combiner of the first HF combiner arrangement. As discussed above, appropriate electrical functional units may be connected at the second end of the feeder cables.

Regardless of when the particular base station outputs its AISG signal, this signal is switched through by the HF combiner according to example non-limiting embodiments to the corresponding feeder cable. This AISG signal is therefore available at the second end of the particular feeder cable, and may be used for controlling the electrical functional units.

BRIEF DESCRIPTION OF THE DRAWINGS

Various embodiments are described below by way of example, with reference to the drawings. Identical subjects have the same reference numerals. In particular, in the corresponding figures of the drawings:

FIGS. 2A, 2B, 2C, and 2D:
are various views of a circuit portion of the electronics unit, via which interruption-free switching of a DC voltage between two signal line terminal contacts over to the common terminal contact is possible;

DETAILED DESCRIPTION OF EXAMPLE NON-LIMITING EMBODIMENTS

Figure 1:
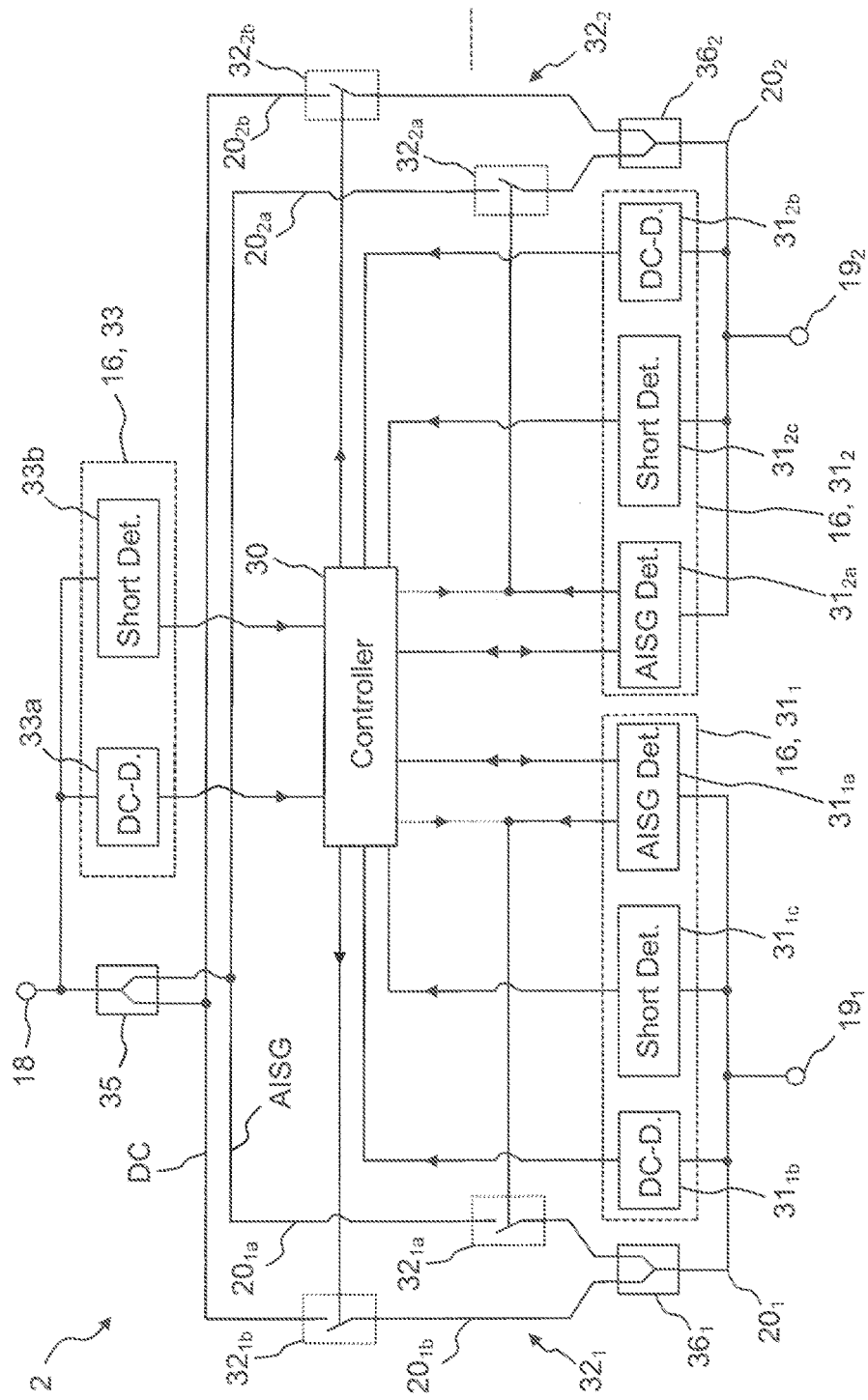
FIG. 1: is a schematic view of an electronics unit of the HF combiner according to example non-limiting embodiments.
Figure 4A:
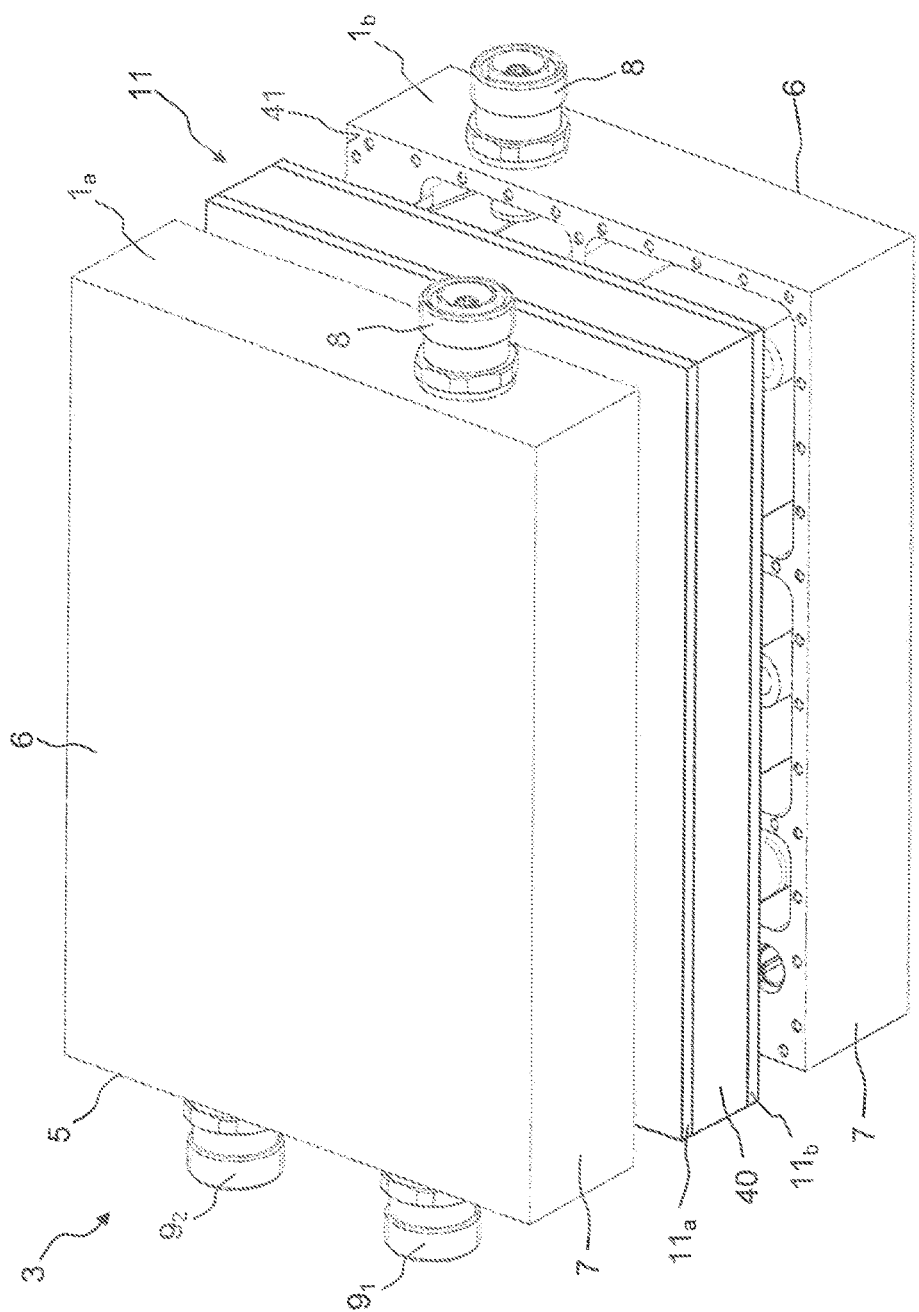
FIGS. 4A, 4B, and 4C:
are various views of an HF combiner arrangement.
Figure 4B:
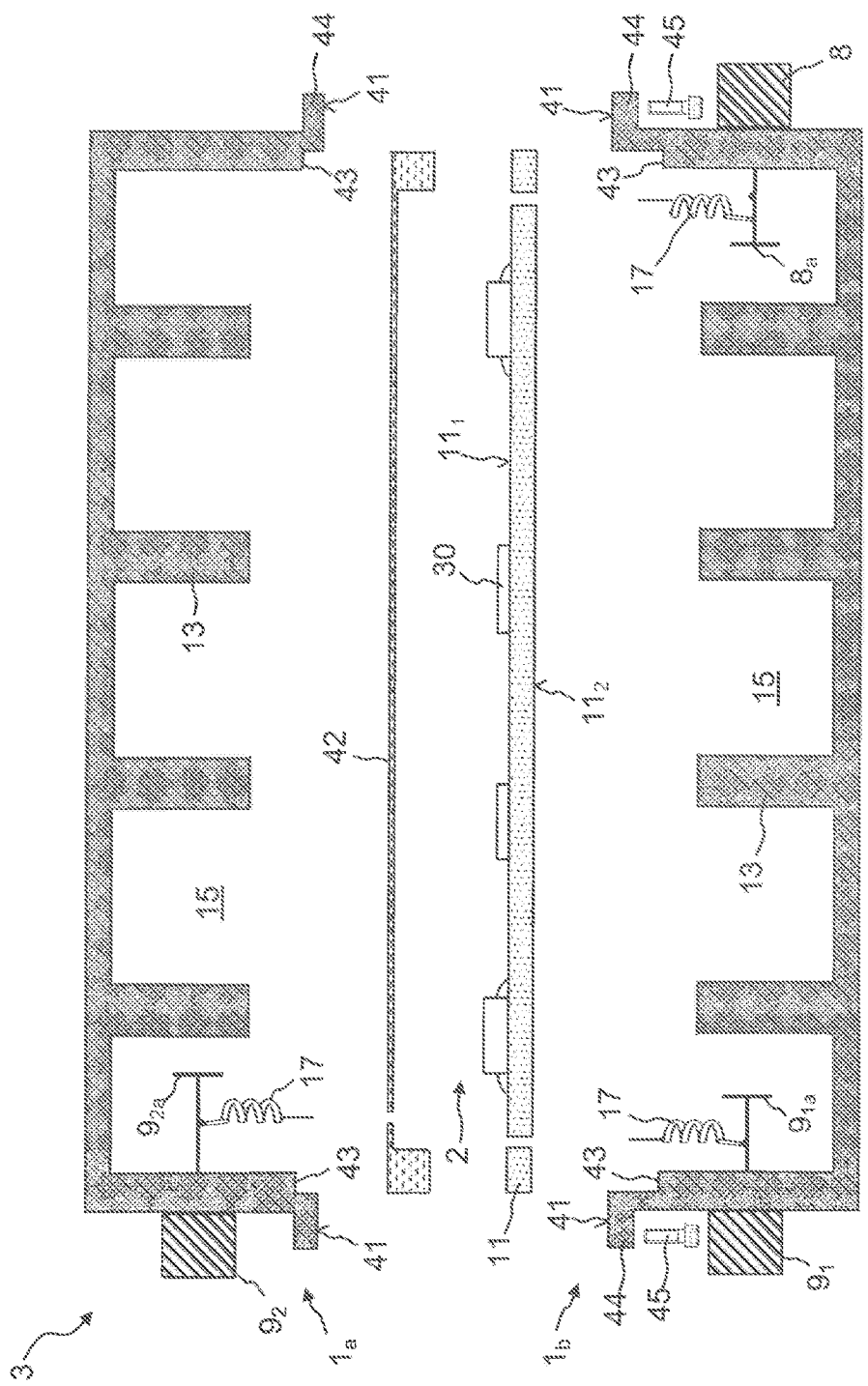
Figure 4C:
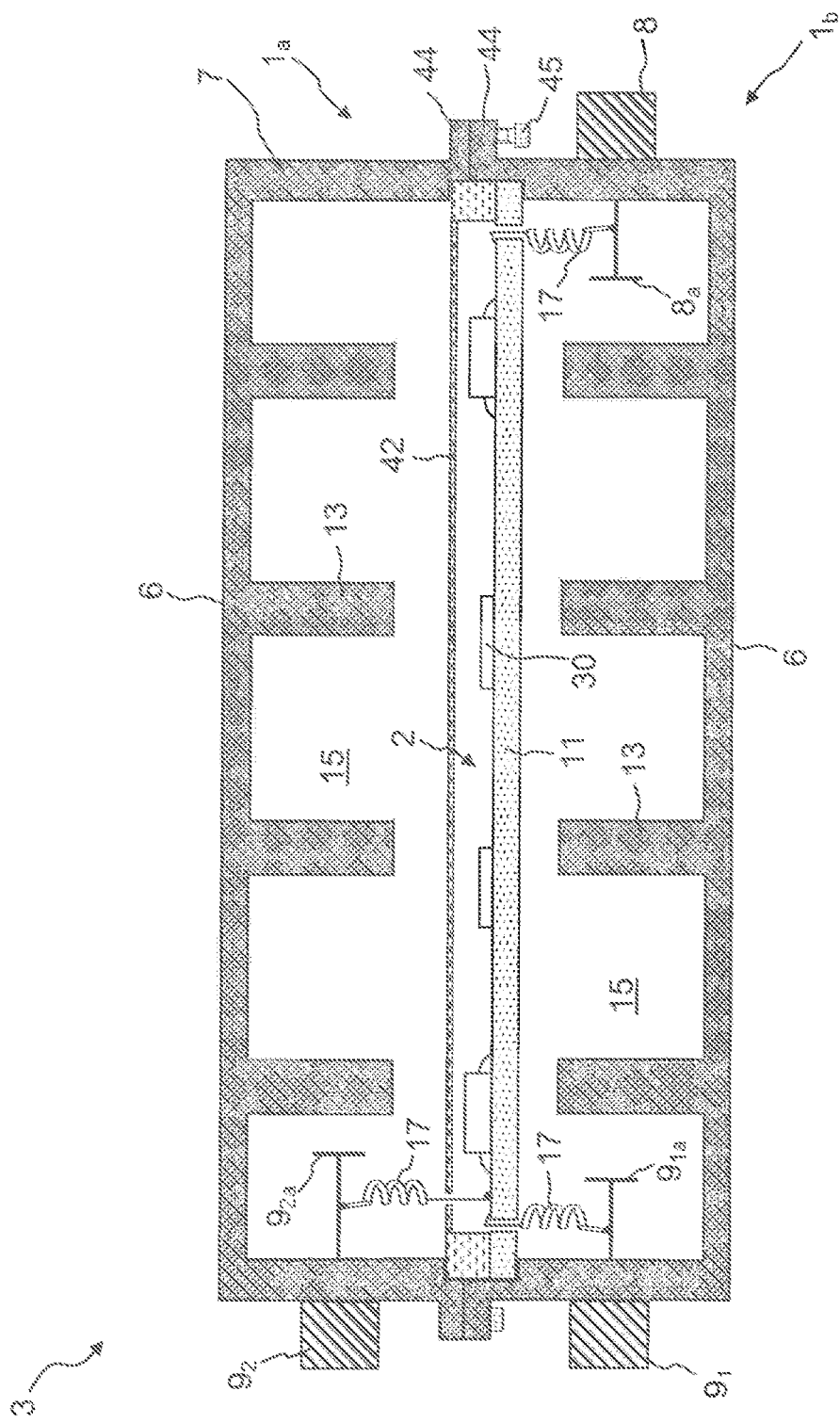
Figure 5:
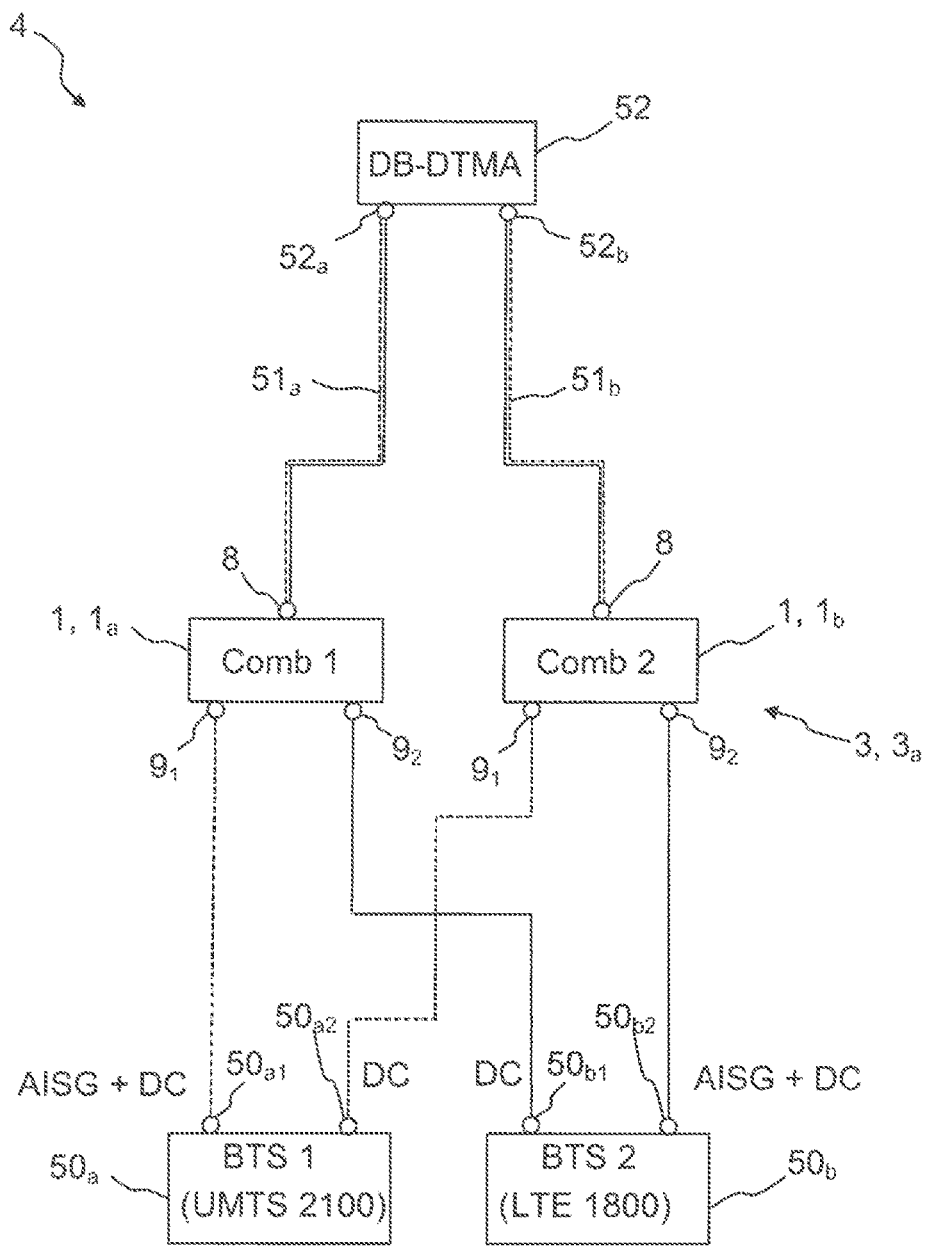
FIG. 5: shows one embodiment of a mobile radio site according to example non-limiting embodiments with two HF combiners and one DB-DTMA.
Figure 6:
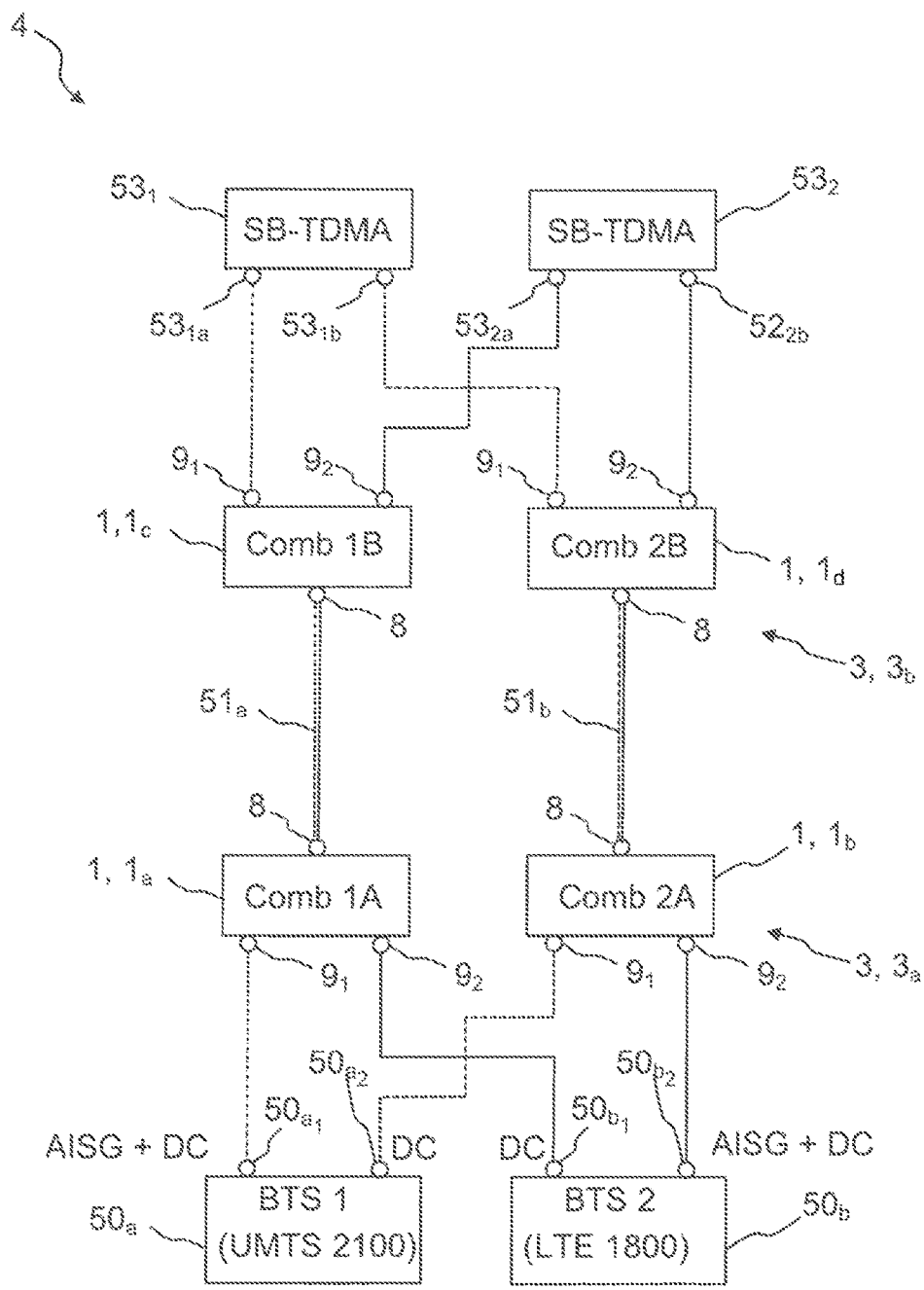
FIG. 6: shows another embodiment of a mobile radio site according to example non-limiting embodiments with four HF combiners and two SB-DTMAs.
Figure 7:
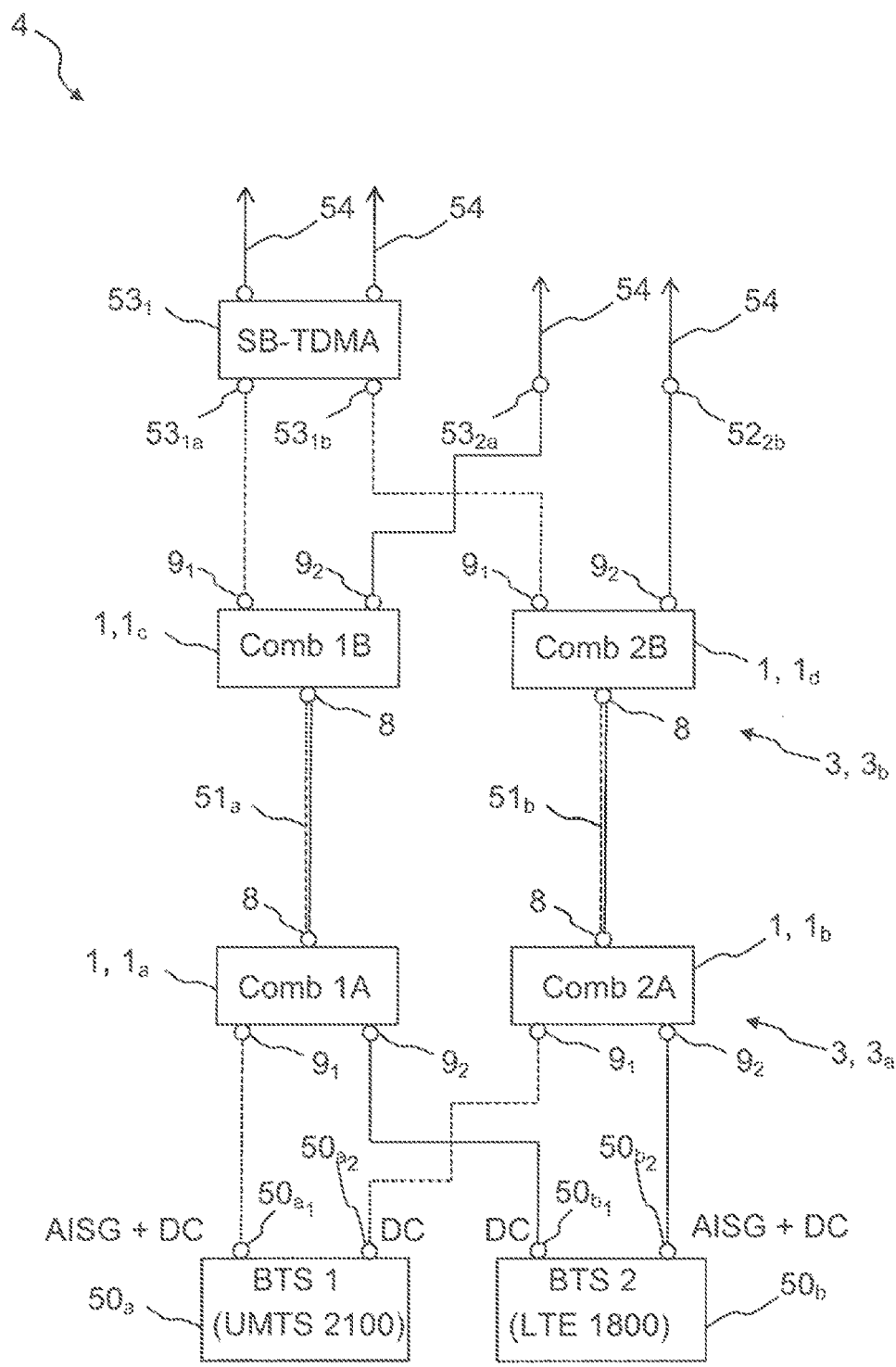
FIG. 7: shows another embodiment of a mobile radio site according to example non-limiting embodiments with four HF combiners, with antenna elements, in part, connected directly to the HF combiner.

The HF combiner 1 according to example non-limiting embodiments is described in greater detail with reference to FIGS. 3A and 3B. FIG. 1 shows an electronics unit 2 that is situated on a circuit board arrangement 11 and via which the low-frequency signals are outcoupled and once again incoupled. FIGS. 2A to 2D show another embodiment of the electronics unit 2. FIGS. 4A, 4B, and 4C show one embodiment of the HF combiner arrangement 3 according to example non-limiting embodiments. Different embodiments of a mobile radio site 4 are shown in FIGS. 5, 6, and 7.

Figure 3A:
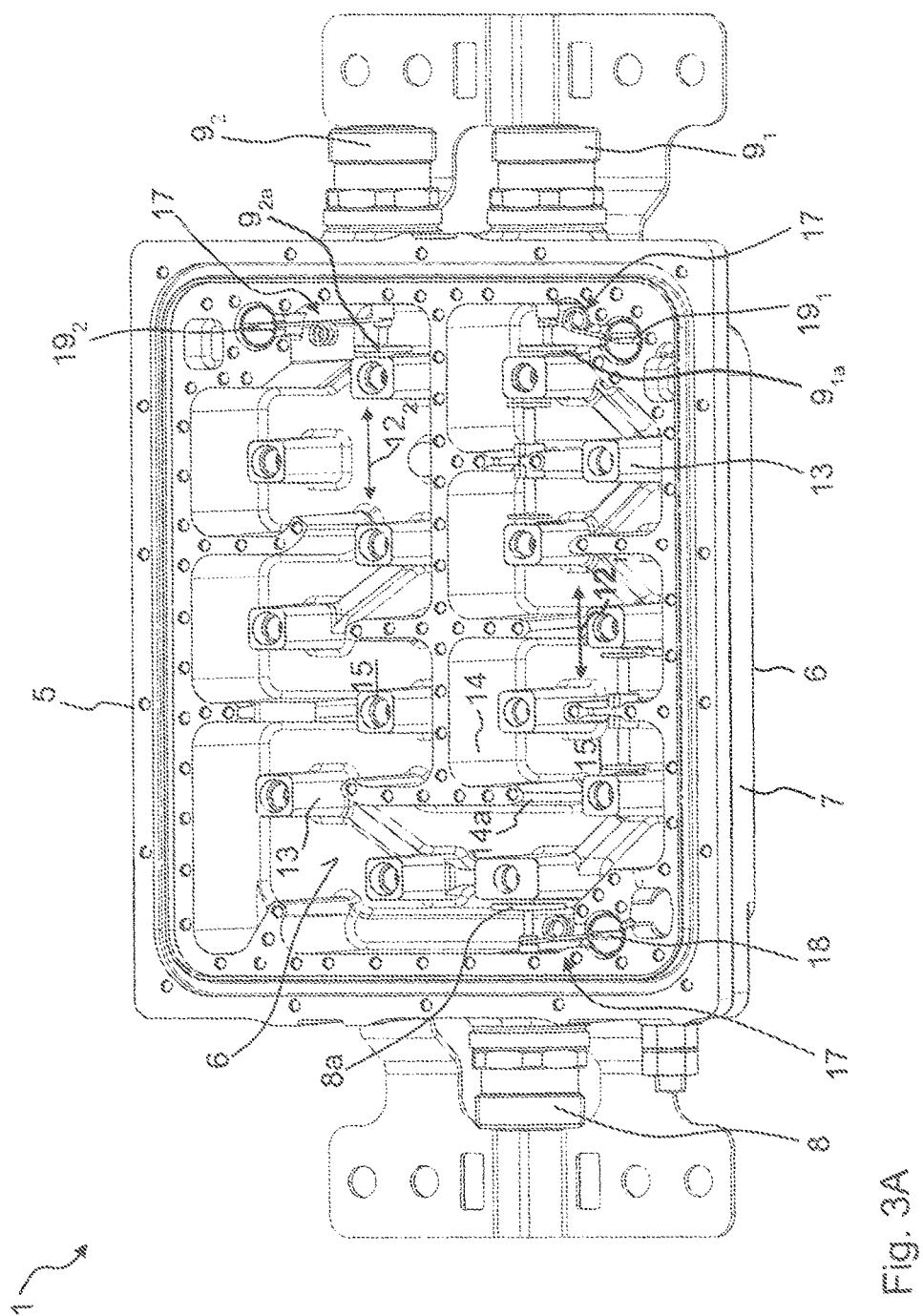
FIG. 3A:
is a schematic view of one embodiment of the HF combiner according to example non-limiting embodiments, in an open illustration.
Figure 3B:
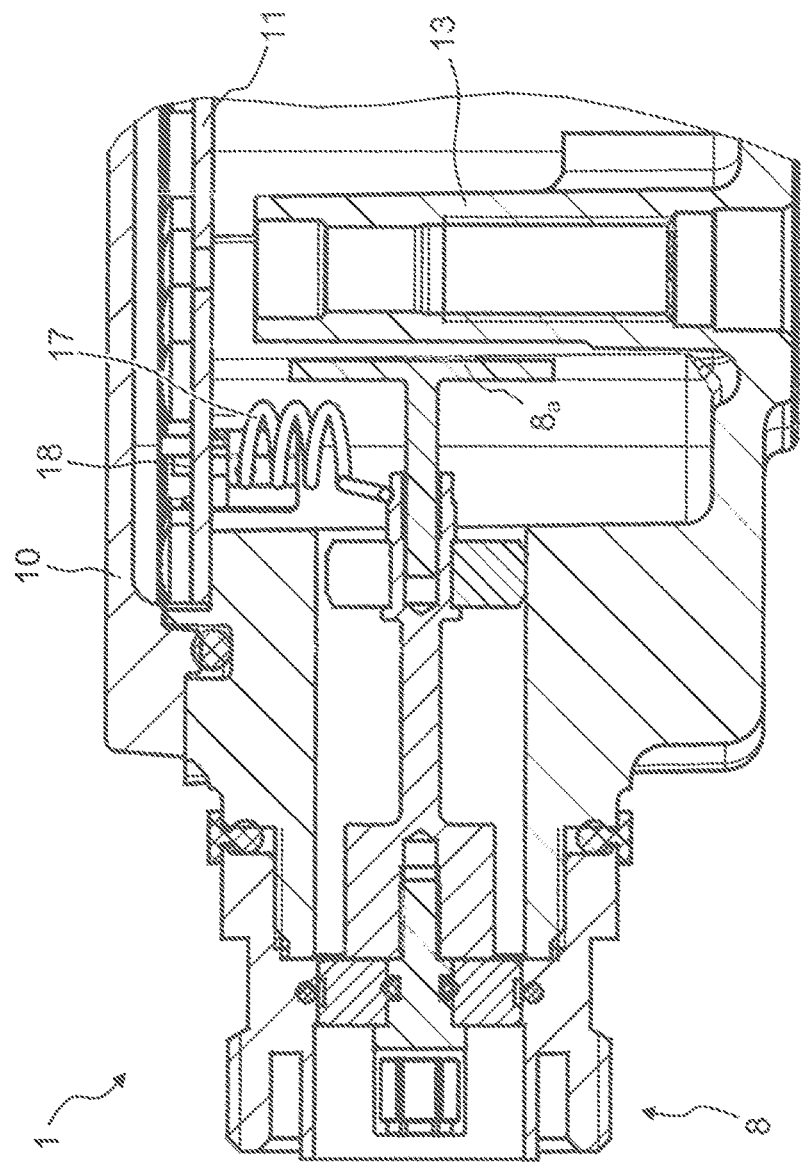
FIG. 3B: is a schematic sectional view of one embodiment of the HF combiner according to example non-limiting embodiments.

FIG. 3A is a top view of an HF combiner 1 having a cavity design, with a housing cover 10 removed (see FIG. 3B) and the circuit board arrangement 11 removed (see FIG. 3B). The HF combiner 1 includes a housing 5 that has a housing base 6, the circuit board arrangement 11 spaced apart from the housing base 6, and a circumferential housing wall 7 between the housing base 6 and the circuit board arrangement 11. The circumferential housing wall 7 surrounds a receiving space 15.

A common terminal 8 and signal line terminals $9_1$, $9_2$, . . . , $9_n$ are mounted on the housing 5, in particular on the circumferential housing wall 7. In particular, there are at least two signal line terminals $9_1$, $9_2$, as also shown in the drawings. However, in principle there could also be more signal line terminals $9_1$, $9_2$, in particular with n≥2, n≥3, or n≥4. The n signal line terminals $9_1$, $9_2$, . . . , $9_n$ are preferably situated on a first side of the circumferential housing wall 7, whereas the common terminal 8 is situated on an oppositely situated second side of the circumferential housing wall 7.

In the description, for many elements the subscript character "n" is provided in addition to the reference numeral, although this is not indicated in the drawings for space reasons. The subscript character "n" is preferably provided upon its first use in order to clarify that there may be more than two of these elements. In particular, the HF combiner 1 according to example non-limiting embodiments, as shown, may be designed as a dual-band combiner with n=2. However, the HF combiner may also be designed as a triple-band combiner (n=3) or as a quad-band combiner (n=4).

The n signal line terminals $9_1$, $9_2$, . . . , $9_n$ are connected and/or coupled to the common terminal 8 within the housing 5 via one of n filter paths $12_1$, $12_2$, . . . , $12_n$ in each case.

Situated in each filter path $12_1$, $12_2$, . . . , $12_n$ is at least one resonator inner conductor 13 that is galvanically connected to the housing base 6 of the housing 5 and extends in the axial direction from the housing base 6 in the direction of the circuit board arrangement 11, and ends at a distance from the circuit board arrangement 11 and/or is galvanically separated therefrom.

The individual filter paths $12_1$, $12_2$, . . . , $12_n$, in which at least one resonator inner conductor 13 is situated in each case, are separated, at least partially, from one another by a wall 14. This wall 14 is galvanically connected to the housing base 6 and extends in the direction of the circuit board arrangement 11. This wall 14 prevents undesirable coupling between the individual filter paths $12_1$, $12_2$, . . . , $12_n$.

The wall 14 may include additional wall segments 14a which delimit the width of the filter paths $12_1$, $12_2$, . . . , $12_n$ from the common terminal 8 towards the respective signal line terminals $9_1$, $9_2$, . . . , $9_n$. Individual resonator chambers are thus formed in which in particular the resonator inner conductors 13 are situated. The coupling of the resonator chambers with one another may be adjusted by means of these wall segments 14a.

The common terminal 8 protrudes into the receiving space 15 within the housing 5, and includes a coupling device 8a. A capacitive, inductive, or also galvanic coupling of the common terminal 8 with the (first, for example) resonator inner conductor 13 is thus possible. In particular, coupling takes place for the resonator inner conductor 13 that is closest to the common terminal 8. A capacitive coupling is shown in the embodiments.

The same also applies for the n signal line terminals $9_1$, $9_2$, . . . , $9_n$, which likewise have corresponding coupling connections $9_{1a}$, $9_{2a}$, . . . , $9_{na}$.

Mobile radio signals are supplied to the respective filter paths $12_1$, $12_2$, . . . , $12_n$ or are received therefrom via these coupling connections $8_a$, $9_{1a}$, $9_{2a}$, . . . $9_{na}$.

However, only high-frequency signals (>300 MHz, for example) can be transmitted via these filter paths $12_1$, $12_2$, . . . , $12_n$. Low-frequency signals (AISG signals, for example) and DC signals cannot be transmitted via these filter paths. Such signals are outcoupled at the particular signal line terminals $9_1$, $9_2$, . . . , $9_n$ or at the common terminal 8 and are conducted via corresponding bypass lines $20_1$, $20_2$, . . . , $20_n$ in order to be coupled back into the common terminal 8 or into the particular signal line terminals $9_1$, $9_2$, . . . , $9_n$.

These bypass lines $20_1$, $20_2$, . . . , $20_n$ are situated on the separate circuit board arrangement 11 (see FIG. 1). For this purpose, the circuit board arrangement has a common terminal contact 18 and n signal line terminal contacts $19_1$, $19_2$, . . . , $19_n$. Each of these signal line terminal contacts $19_1$, $19_2$, . . . , $19_n$ is galvanically connected to the corresponding signal line terminal $9_1$, $9_2$, . . . , $9_n$. This connection is established in each case via a connection cable in which at least one low-pass filter 17 is also situated, as shown by the coil in FIG. 3A, for example. This low-pass filter 17 ensures that no mobile radio signals can also be outcoupled. However, DC signals and AISG signals may be transmitted via the low-pass filter 17.

The common terminal 8 and the n signal line terminals $9_1$, $9_2$, . . . , $9_n$ are suitable for connecting coaxial cables. An outer conductor of such a coaxial cable is electroconductively connected to the housing 5 of the HF combiner 1. An inner conductor of such a coaxial cable is galvanically connected to the particular coupling connections $8_a$, $9_{1a}$, $9_{2a}$, . . . $9_{na}$.

According to FIG. 1, each of the n signal line terminal contacts $19_1$, $19_2$, . . . $19_n$ is connected or connectable to the common terminal contact 18 via one of the n bypass lines $20_1$, $20_2$, . . . , $20_n$ in each case. This connection is low resistance. The line resistance is in particular less than 3Ω, 2Ω, or less than 1Ω.

The electronics unit 2 includes a control device 30 and a detector device 16. This detector device 16 can detect in particular a DC signal, an AISG signal, and a short circuit at each of the n signal line terminals $9_1$, $9_2$, . . . , $9_n$, or a DC signal and a short circuit at the common terminal 8. The short circuit may be detected via a shunt resistor, for example. Contactless measurement would also be possible. The DC signal and the AISG signal may be detected by A/D converters and/or comparators, for example. For example, an A/D converter having n inputs for each signal line terminal $9_1$, $9_2$, . . . , $9_n$, and another input for the common terminal would be sufficient. This would apply to the measurement of the DC signal and of the AISG signal. It would also be possible to use only one A/D converter or one comparator for measuring all DC signals and all AISG signals. In this case, the respective signal line terminals $9_1$, $9_2$, . . . , $9_n$ and the respective common terminal 8 would have to be connected in very quick succession, via corresponding multiplex switches, for the measurement with the A/D converter or the comparator.

However, it is shown in the embodiments that the detector device 16 is preferably formed by n signal line detector devices $31_1$, $31_2$, . . . , $31_n$ and one common detector device 33. Therefore, the following discussion always refers to the n signal line detector devices $31_1$, $31_2$, . . . , $31_n$ and the common detector device 33. Everything discussed with regard to the n signal line detector devices $31_1, 31_2, \ldots, 31_n$ and the common detector device 33 therefore also applies to the detector device 16.

In the embodiments, the electronics unit 2 therefore includes the control device 30, the detector device 16 having the n signal line detector devices $31_1, 31_2, \ldots, 31_n$, and the common detector device 33 and at least n signal line switching devices $32_1, 32_2, \ldots, 32_n$.

The n signal line switching devices $32_1, 32_2, \ldots, 32_n$ each include a first switching unit $32_{1a}, 32_{2a} \ldots, 32_{na}$. The respective, at least one first switching unit $32_1, 32_2$ is situated in each of the n bypass lines $20_1, 20_2$.

Each of then signal line detector devices $31_1, 31_2$ is connected or coupled to the respective one of the n signal line terminal contacts $19_1, 19_2$. The n signal line detector devices could also be connected or coupled between one of the n signal line terminals $9_1, 9_2$ and the respective first switching unit $32_{1a}, 32_{2a}$.

The n signal line detector devices $31_1, 31_2$, in a BTS operating state, are designed to detect whether an AISG signal is present at one of the n signal line terminal contacts $19_1, 19_2$. For this purpose, the n signal line detector devices $31_1, 31_2$ include an AISG detector unit $31_{1a}, 31_{2a}, \ldots, 31_{na}$. In the embodiment, the signal line detector devices $31_1, 31_2$ in each case also include a DC detector unit $31_{1b}, 31_{2b}, \ldots, 31_{nb}$ and a short circuit detector unit $31_{1c}, 31_{2c}, \ldots, 31_{nc}$.

The common detector device 33 preferably includes a DC detector unit $33_a$ and a short circuit detector unit $33_b$.

When an AISG signal is detected at the respective signal terminal contact $19_1, 19_2$, the control device 30 or the respective one of the n signal line detector devices $31_1, 31_2$ is designed to control the first switching unit $32_{1a}$ or $31_{2a}$ in the respective bypass line $20_1, 20_2$ in such a way that the first switching unit electrically connects the particular one of the n signal line terminal contacts $19_1, 19_2$, at which the AISG signal has been detected, to the common terminal contact 18. This connection preferably has low resistance. This preferably takes place only in the BTS operating state.

The electronics unit 2 also has a common signal splitter 35 and n terminal signal splitters $36_1, 36_2, \ldots, 36_n$. The common signal splitter 35 and the n terminal signal splitters $36_1, 36_2, \ldots, 36_n$ each include a first, a second, and a third terminal, and are designed to divide a mixed signal (superimposed signal), composed of a DC signal and an AISG signal, that is present at the first terminal, and to output the DC signal at the second terminal and output the AISG signal at the third terminal. The common signal splitter and the n terminal signal splitters are also designed to combine a DC signal that is present at the second terminal, and an AISG signal that is present at the third terminal, and output them as a mixed signal at the first terminal.

The common signal splitter 35 at its first terminal is electrically connected to the common terminal contact 18. Each of the n terminal signal splitters $36_1, 36_2, \ldots, 36_n$ at its first terminal is connected to the respective signal line terminal contact $19_1, 19_2, \ldots, 19_n$, as the result of which each of the n bypass lines $20_1, 20_2, \ldots, 20_n$ is divided into an AISG line segment $20_{1a}, 20_{2a}, \ldots, 20_{na}$ and a DC line segment $20_{1b}, 20_{2b}, \ldots, 20_{nb}$. The respective second terminals of the n terminal signal splitters $36_1, 36_2$ are electrically connected to one another and to the second terminal of the common signal splitter 35. This connection is also low resistance. The same also applies for the third terminals of the n terminal signal splitters $36_1, 36_2$. These are likewise electrically connected to one another and to the third terminal of the common signal splitter 35. This connection is also low resistance. Thus, on the one hand all AISG line segments $20_{1a}, 20_{2a}$, and on the other hand all DC line segments $20_{1b}, 20_{2b}$, are electrically connected to one another.

The common signal splitter 35 and the terminal signal splitters $36_1, 36_2$ may also be referred to as crossovers, which divide a mixed signal in question based on the frequencies that are present, and appropriately output it to the second and third terminals.

In the embodiment shown, the first switching unit $32_{1a}, 32_{2a}$ of the respective signal line switching device $32_1, 32_2$ is situated in each of the AISG line segments $20_{1a}, 20_{2a}$. When this first switching unit $32_{1a}, 32_{2a}$ is actuated, the respective AISG line segment $20_{1a}, 20_{2a}$ is disconnected or connected.

It is also shown in FIG. 1 that the n signal line switching devices $32_1, 32_2$ in each case include at least one second switching unit $32_{1b}, 32_{2b}, \ldots, 32_{nb}$. In each case a second switching unit $32_{1b}, 32_{2b}$ of one of the n signal line switching devices $32_1, 32_2$ is situated in each DC line segment $20_{1b}, 20_{2b}$. When the second switching unit $32_{1b}, 32_{2b}$ is actuated, the corresponding DC line segment $20_{1b}, 20_{2b}$ is disconnected or connected.

The first switching unit $32_{1a}, 32_{2a}$ as well as the second switching unit $32_{1b}, 32_{2b}$ are in particular each formed by a relay. Bistable relays are preferably used. These relays maintain their switching state even when they are not acted on by a voltage. As a result, the power consumption of the HF combiner 1 for the electronics unit 2 is reduced. Semiconductor elements such as CMOS switches, TRIACS, or an arrangement made up of two MOSFETs or microswitches may also be used. However, relays are preferred due to the better protection from lightning.

The common detector device 33 is preferably connected or coupled to the common terminal contact 18. The common detector device could also be connected or coupled between the common terminal 8 and the n signal line switching devices $32_1, 32_2$ or the common signal splitter 35.

In particular a shunt resistor is used for measuring a short circuit. An outcoupling, in particular by means of a voltage divider, may be used for measuring a DC signal and/or an AISG signal.

The signal line detector devices $31_1, 31_2$ can detect a DC signal at the respective signal line terminal contact $19_1, 19_2$. This takes place in particular via the respective DC detector unit $31_{1b}, 31_{2b}$. The common detector device 33 is likewise designed to detect whether a DC signal is present at the common terminal contact 18. This takes place once again via the DC detector unit $33a$. The common detector device 33 and also the respective signal line detector device $31_1, 31_2$ transmit their measuring results, in the form of analogue or digital values, to the control device 30.

When the control device 30 is started, it assumes a starting operating state. From there, it changes over into the BTS operating state when one of the signal line detector devices $31_1, 31_2$ detects a DC signal at one of the signal line terminal contacts $19_1, 19_2$. This is an indication that the HF combiner 1 is supplied with power from the particular base station $50_a, 50_b, \ldots 50_n$.

In addition, the control device 30 is designed to change from the starting operating state into an ANT operating state. This takes place when the common detector device 33 detects a DC signal at the common terminal contact 18. In this case, it is to be assumed that the HF combiner 1 is supplied with electrical energy via the common terminal 8, which indicates that the HF combiner 1 is situated on the antenna mast, and not at the base stations $50_a, 50_b$.

The control device 30 in the starting operating state is designed in particular to control the n signal line switching devices $32_1$, $32_2$ in such a way that the n bypass lines $20_1$, $20_2$ are disconnected, as the result of which the n signal line terminal contacts $19_1$, $19_2$ are electrically disconnected from the common terminal contact 18. In this case, it may be detected in a particularly easy manner whether a DC signal is present at the common terminal contact 18 or at one of the signal line terminal contacts $19_1$, $19_2$ in order to select the appropriate operating state.

The control device 30 in the BTS operating state is designed to electrically connect the particular one of the n signal line terminal contacts $19_1$, $19_2$, at which a DC signal has first been detected, to the common terminal contact 18 by controlling the corresponding signal line switching device $32_1$, $32_2$. The control device 30 is also designed to electrically disconnect the other signal line terminal contacts $19_1$, $19_2$, at which a DC signal has not been detected until later, from the common terminal contact 18 by controlling the corresponding signal line switching devices $32_1$, $32_2$. In this way, the situation is avoided that differences in potential cause a current flow between the individual signal terminal contacts $19_1$, $19_2$, which could damage the base stations $50_a$, $50_b$. In this case, preferably only the second switching unit $32_{1b}$, $32_{2b}$ of the corresponding signal line switching devices $32_1$, $32_2$ is actuated. As a result, the corresponding signal line terminal contact $19_1$, $19_2$ is electrically connected to the common terminal contact 18 solely via the respective DC line segment $20_{1b}$, $20_{2b}$.

In the BTS operating state, for the case that an AISG signal is detected at one of the n signal line terminal contacts $19_1$, $19_2$, the control device 30 is also designed in particular so that the corresponding signal line switching device $32_1$, $32_2$ is controlled by the control device 30 that the signal line switching device electrically connects the respective signal line terminal contact $19_1$, $19_2$ to the common terminal contact 18, so that the AISG signal is also present at the common terminal contact 18. In particular only the corresponding first switching unit $32_{1a}$, $32_{2a}$ is hereby actuated. In this case, it is possible that a DC signal is supplied from a first signal line terminal contact $19_1$ to the common terminal contact 18, whereas an AISG signal is transmitted from a second signal line terminal contact $19_2$ to the common terminal contact 18.

However, for the case that both an AISG signal and a DC signal are detected at a single signal line terminal contact $19_1$, $19_2$, the control device 30 or also the corresponding signal line detector device $31_1$, $31_2$ is directly capable of controlling the corresponding signal line switching device $32_1$, $32_2$ in such a way that the latter electrically connects the corresponding signal line terminal contact $19_1$, $19_2$ (at which the AISG signal and the DC signal are present) to the common terminal contact 18. This connection is low resistance. The control device 30 is also able to control all other activated signal line switching devices $32_1$, $32_2$ in such a way that the latter disconnect an electrical connection between their respective signal line terminal contacts $19_1$, $19_2$ and the common terminal contact 18.

Such a changeover takes place in particular without interruption. Therefore, a DC signal is always present at the common terminal contact 18. FIGS. 2A to 2D show a circuit portion of the electronics unit 2 via which such an interruption-free changeover may be achieved.

FIG. 2A shows that a DC signal is present at the first signal line terminal contact $19_1$. This signal has been detected and the second switching unit $32_{1b}$ has subsequently been controlled in such a way that it establishes an electrical connection between the first signal line terminal contact $19_1$ and the common terminal contact 18. The terminal signal splitters $36_1$, $36_2$ and the common signal splitter 35 are indicated only via the dotted-line conductor track. The electronics unit 2, i.e. the HF combiner 1, in this case also includes n signal line terminal diodes $37_1$, $37_2$, ..., $37_n$, wherein each of the n signal line terminal diodes $37_1$, $37_2$, ..., $37_n$ with its anode is electrically connected to the respective DC line segment $20_{1b}$, $20_{2b}$, ... $20_{nb}$ between the respective signal line terminal contact $19_1$, $19_2$, ..., $19_n$, or between the respective terminal signal splitter $36_1$, $36_2$, ..., $36_n$ and the respective second switching unit $32_{1b}$, $32_{2b}$, ..., $32_{nb}$. In contrast, the signal line terminal diodes $37_1$, $37_2$, ..., $37_n$ with their cathodes are electrically connected to one another. In addition, a common terminal diode 38 is also provided, which with its anode is connected to the electrically interconnected DC line segments $20_{1b}$, $20_{2b}$, ..., $20_{nb}$ at the output of the respective second switching unit $32_{1b}$, $32_{2b}$, ..., $32_{nb}$. The cathode of the common terminal diode 38 is directly or indirectly connected to the common terminal contact 18. An indirect connection is present when the cathode of the common terminal diode 38 is electrically connected, for example, to the second terminal of the common signal splitter 35.

Furthermore, a changeover switch 39 is also provided. The changeover switch includes at least one first terminal that is electrically connected to the cathode of the common terminal diode 38. A second terminal is connected to the anode of the common terminal diode 38. All DC line segments $20_{1b}$, $20_{2b}$, ..., $20_{nb}$ are combined at this second terminal. A third terminal of the changeover switch 39 is electrically connected to the cathodes of all signal line terminal diodes $37_1$, $37_2$, ..., $37_n$.

In a first switching state of the changeover switch 39, the changeover switch connects its first terminal to its second terminal. This situation is shown in FIG. 2A. This first switching state is assumed in particular when a DC signal has been detected at a signal line terminal contact $19_1$, $19_2$, ..., $19_n$, and this DC signal is switched to the common terminal contact 18 by controlling the respective second switching unit $32_{1b}$, $32_{2b}$, ..., $32_{nb}$. Due to the higher resistance of the common terminal diode 38, most of the current flows across the changeover switch 39.

If a DC signal and an AISG signal are subsequently detected at another signal line terminal contact $19_1$, $19_2$, ..., $19_n$ (in the present case, at the second signal line terminal contact $19_2$), not only the AISG signal, but preferably also the DC signal is switched through without interruption to the common terminal contact 18. However, the possibility of a current flow taking place between two signal line terminal contacts $19_1$, $19_2$, ..., $19_n$ must be avoided, since otherwise the particular base stations $50_a$, $50_b$ are short-circuited. In this case, instead of switching through the DC signal from the first signal line terminal contact $19_1$, only the DC signal from the second signal line terminal contact $19_2$ should be switched through to the common terminal contact 18. To achieve such a change, the changeover switch 39 assumes a second switching state. In this second switching state, the changeover switch connects its first terminal to its third terminal (see FIG. 2B).

In this case, the current flow takes place on the one hand through the common terminal diode 38 and the second switching unit $32_{1b}$ of the first signal line switching device $32_1$, and on the other hand, through the first and second signal line terminal diodes $37_1$, $37_2$. It would also be possible for the changeover switch 39 to assume an intermediate switching state, and in this intermediate switching state to connect its first terminal neither to its second terminal nor to its third terminal. In this case, the current flow would take place solely across the common terminal diode 38. A direct current flow between the signal line terminal contacts $19_1$, $19_2$ is not possible due to the signal line terminal diodes $37_1$, $37_2$. The second switching unit $32_{2b}$ of the second signal line switching device $32_2$ is still open here. After the intermediate switching state, the changeover switch 39 goes into its second switching state.

As soon as the changeover switch 39 has assumed its second switching state, the second switching unit $32_{1b}$ of the first signal line switching device $32_1$ may be opened. In this case, the transmission of the DC signal takes place solely via the two signal line terminal diodes $37_1$, $37_2$ and the changeover switch 39. After the second switching unit $32_{1b}$ of the first signal line switching device $32_1$ has opened, the second switching unit $32_{2b}$ of the second signal line switching device $32_2$ can be closed. This state is shown in FIG. 2C. A DC signal additionally flows across the second switching unit $32_{2b}$ of the second signal line switching device $32_2$ and the common terminal diode 38.

The changeover switch 39 then once again assumes its first switching state (see FIG. 2D). The transmission of the DC signal in this switching state once again takes place primarily via the changeover switch 39 and the second switching unit $32_{2b}$ of the second signal line switching device $32_2$. The control of the changeover switch 39 preferably takes place via the control device 30. The changeover switch 39 is in particular a relay, preferably a single pole/double throw relay.

In principle, it is the case in particular that at no time (in the BTS operating state) is more than one second switching unit $32_{1b}$, $32_{2b}$, ..., $32_{nb}$ closed (in particular when a DC signal has been detected at the corresponding signal line terminal contacts $19_1$, $19_2$, ..., $19_n$). Of course, this is different in the ANT operating state. In the BTS operating state, the same may also apply for the first switching units $32_{1a}$, $32_{2a}$, ..., $32_{na}$.

In this case, the AISG signal and the DC signal are transmitted to the common terminal contact 18 solely from a single signal line terminal contact $19_1$, $19_2$. The control device 30 or the corresponding signal line detector device $31_1$, $31_2$ controls the first switching unit $32_{1a}$, $32_{2a}$ as well as the second switching unit $32_{1b}$, $32_{2b}$ of the corresponding signal line switching device $32_1$, $32_2$. This prevents the base station $50_a$, $50_b$, which for example has been started first, from being responsible for the entire power supply to all electrical functional units on the antenna mast. According to example non-limiting embodiments, in this case each base station $50_a$, $50_B$ supplies only a portion of the electrical functional units.

For the case that an AISG signal is detected at two signal line terminal contacts $19_1$, $19_2$, the corresponding signal line switching devices $32_1$, $32_2$ are preferably controlled in such a way that they disconnect the corresponding signal line terminal contacts $19_1$, $19_2$, at least for the AISG signal and preferably likewise for the DC signal, from the common terminal contact 18. In this case, no AISG signal would be present at the common terminal contact 18.

The common detector device 33 is preferably also designed to detect whether a short circuit is present at the common terminal contact 18. In this case, the control device 30 is designed to connect the corresponding signal line terminal contact $19_1$, $19_2$ to the common terminal contact 18 only when no short circuit has been detected by the common detector device 33. This applies in particular for the respective first and second switching unit $32_{1a}$, $32_{2a}$, $31_{1b}$, $32_{2b}$.

Such a short circuit may occur, for example, when antenna elements 54 are directly connected to the signal line terminal contact $19_1$, $19_2$ of the HF combiner 1 on the antenna side.

The signal line detector devices $31_1$, $31_2$ are also designed to detect a short circuit at their respective signal line terminal contacts $19_1$, $19_2$. The control device 30, in the ANT operating state, is then designed to electrically connect the common terminal contact 18 only to those n signal line terminal contacts $19_1$, $19_2$ at which no short circuit has been detected. For the other signal line terminal contacts $19_1$, $19_2$, the connection is interrupted by controlling the corresponding signal line switching devices $32_1$, $32_2$.

For the case that the control device 30 is in the ANT operating state, the first as well as the second switching units $32_{1a}$, $33_{2a}$, $32_{1b}$, $32_{2b}$ may be controlled in such a way that the common terminal contact 18 is connected to all signal line terminal contacts $19_1$, $19_2$ that are not affected by a short circuit. In this case, an AISG signal that is present at the common terminal contact 18 is output at all signal line terminal contacts $19_1$, $19_2$. This is not a problem, since the AISG protocol allows addressing of the individual AISG-capable electrical functional units. In contrast, the second switching units $32_{1b}$, $32_{2b}$ can all establish an electrical connection with the signal line terminal contacts $19_1$, $19_2$ that are not affected by a short circuit, as the result of which a DC signal can be transmitted to these signal line terminal contacts.

The control device 30 in the BTS operating state and also in the ANT operating state is designed to monitor a level for the DC signals at the common terminal contact 18 and/or the respective signal line terminal contacts $19_1$, $19_2$. If the level falls below a certain settable threshold value (for example, below 35 V, 30 V, 25 V, 20 V, 15 V, 10 V), the corresponding signal line switching devices $32_1$, $32_2$, or all of them, are then controlled in such a way that they interrupt the electrical connection. This is meaningful in particular when the corresponding base stations $50a$, $50b$ are switched off. As a result, when the base station $50a$, $50b$ is restarted, the signal line switching devices $32_1$, $32_2$ are set in such a way that the electrical connection between the common terminal contact 18 and the n signal line terminal contacts $19_1$, $19_2$ is interrupted (see bistable relay).

The electronics unit 2 shown in FIG. 1 is preferably situated on the circuit board arrangement 11.

As described above, the control device 30 in the BTS operating state, when an AISG signal is detected at one of the n signal line terminal contacts $19_1$, $19_2$, is designed to transmit or switch through the AISG signal to the common terminal contact 18 by controlling the corresponding signal line switching devices $32_1$, $32_2$. However, this preferably takes place so rapidly that even the first bit, in particular the first on/off keying pulse of the AISG signal designed as an on/off keying signal, is transmittable by more than 70%, 80%, 90% to the common terminal contact 18. An on/off keying pulse may also be referred to as an on/off keying burst. Namely, the electrical functional unit in question is then still able to completely detect the command transmitted by the AISG signal and subsequently implement it. The corresponding signal line detector device $31_1$, $31_2$ and the AISG detector unit $31_{1a}$ or $31_{2a}$ therein may include a comparator, for example, whose threshold is set in such a way that the signal level of the on/off keying signal is reliably detected, and a change in the signal level at the comparator outlet takes place when this threshold is exceeded within a very short period of time. This change may then be detected by the control device 30. In this case, the control of the corresponding signal line switching device $32_1$, $32_2$ or of the first switching unit $32_{1a}$, $32_{2a}$ may also take place directly via the respective AISG detector unit $31_{1a}$ or $31_{2a}$.

In FIG. 1 the arrows preferably indicate the direction in which information and switching pulses are transmitted from and to the control device 30. In principle, an information transfer in both directions would also be conceivable.

FIG. 4A shows an example of the design of the HF combiner arrangement 3 according to example non-limiting embodiments. The HF combiner arrangement includes a first and a second HF combiner $1_a$, $1_b$, which may be designed as described at the outset. Only the housing cover 10, shown in FIG. 3B, is not necessary. The corresponding receiving spaces 15 of the first HF combiner $1_a$ are electrically or electromagnetically separated from the receiving space 15 of the second HF combiner $1_b$ by the circuit board arrangement 11. The circuit board arrangement 11 is shown between the HF combiners $1_a$ and $1_b$ in FIG. 4A. The first and the second HF combiner $1_a$, $1_b$ are placed one on top of the other in an inverted manner, so that the respective receiving spaces 15 are opposite one another.

The circuit board arrangements 11 of the first and the second HF combiner $1_a$, $1_b$ include a circuit board $11_a$, $11_b$, respectively. The respective electronics unit 2 of the first and the second HF combiner $1_a$, $1_b$ is situated only on a first side of the respective circuit board $11_a$, $11_b$. The first sides of the circuit boards $11_a$, $11_b$ are situated opposite one another, a second side of the respective circuit board $11_a$, $11_b$ being coated with a metal layer. The respective electronics unit 2 is therefore situated in a spacing gap 40 between the two circuit boards $11_a$, $11_b$. In principle, the two circuit boards $11_a$, $11_b$, as discussed below, may be situated within the circumferential housing wall 7 of the respective HF combiner $1_a$, $1_b$. However, they may also rest on the end-face side 41 of the circumferential housing wall 7 of the respective HF combiner $1_a$, $1_b$, the spacing gap 40 preferably being surrounded by a housing that prevents the incoupling of interfering radiation sources from outside the HF combiner arrangement 3.

Another embodiment of the HF combiner arrangement 3 according to example non-limiting embodiments is described with reference to FIGS. 4B and 4C. These drawings show a cross section of the first and second HF combiners $1_a$, $1_b$, with only the sectioned portions being illustrated (for example, the common terminal 8 of the first HF combiner $1_a$, not sectioned, is omitted). The circuit board arrangement 11 of the first and the second HF combiner $1_a$, $1_b$ has a shared circuit board 11 or is designed as a shared circuit board 11. The electronics unit 2 of the first HF combiner $1_a$ and the electronics unit 2 of the second HF combiner $1_b$ are situated on a first side $11_1$ of this shared circuit board 11. The opposite second side $11_2$ of the shared circuit board 11 is preferably provided with a metal layer. The shared circuit board 11 has the common terminal contact 18 and the signal line terminal contacts $19_1$, $19_2$ of the first and the second HF combiner $1_a$, $1_b$. In addition, a shielding cover 42 is situated between the first side $11_1$ of the shared circuit board 11 and the first HF combiner $1_a$, so that the first side $11_1$ of the shared circuit board 11 is electrically or electromagnetically separated or decoupled from the receiving space 15 of the first HF combiner $1_a$. It would also be possible for a further shielding cover to likewise be situated between the second side $11_2$ of the shared circuit board 11 and the second HF combiner $1_b$.

FIG. 4C shows the HF combiner arrangement 3 in an assembled state.

The connection, in particular the soldering, of the low-pass filters 17 to the shared circuit board 11 takes place in particular in the disassembled state. In principle, for this purpose an appropriate connection cable may be correspondingly longer than shown in FIGS. 4B and 4C. The soldering point on the shared circuit board 11 is also referred to as a signal line terminal contact $19_1$, $19_2$ or as a common terminal contact 18.

The circumferential housing wall 7 of the first HF combiner $1_a$ includes the end-face side 41, a portion of the end-face side 41 that adjoins the receiving space 15 being offset in the direction of the housing base 6, thus forming a first support shoulder 43. The same also applies for the circumferential housing wall 41 of the second HF combiner $11_b$. The shared circuit board 11 rests on the second support shoulder 43 of the second HF combiner $1_b$, and the shielding cover 42 rests on the first support shoulder 43 of the first HF combiner $1_a$.

For the case that two separate circuit boards $11_a$, $11_b$ are used (see FIG. 4A), the circuit board $11_a$ of the first HF combiner $1_a$ rests on the first support shoulder 43 of the first HF combiner $1_a$, and the circuit board $11_b$ of the second HF combiner $1_b$ rests on the second support shoulder 43 of the second HF combiner $1_b$.

In other words, the respective circumferential housing wall 7 of the first or second HF combiner $1_a$, $1_b$ has a step- or shoulder-shaped recess at the portion of the circumferential housing wall 7 that adjoins the respective receiving space 15.

In addition, a flange-shaped projection 44 is preferably formed on the circumferential housing wall 7 of the first and the second HF combiner $11_a$, $11_b$ in the region of the respective end-face side 41. The flange-shaped projections 44, which protrude outside the housing 5, come to rest one on top of the other in the assembled state of the HF combiner arrangement 3, so that the two HF combiners $1_a$, $1_b$ are fixed to one another via a screw connection 45. This connection is hereby shielded from high frequency. In principle, an additional sealing element could also be introduced here.

Due to the design made up of two HF combiners $1_a$, $1_b$, the HF combiner arrangement 3 according to example non-limiting embodiments also involves an inventive concept, according to which the electronics unit 2, as described in conjunction with the respective HF combiner $1_a$, $1_b$, is dispensed with. This inventive concept is independently described in claims 18 and 19; in this case, claim 18 does not necessarily have to back-reference claim 1. Only the individual bypass lines $20_1$, $20_2$ from the respective signal line terminal contact $19_1$, $19_2$ towards the common terminal contacts 18 would be situated on the particular circuit board arrangement 11 (or the shared circuit board 11). The corresponding electronics unit 2 would not be necessary for this purpose. The connection could then be static.

FIG. 5 shows another embodiment which describes a mobile radio site 4 according to example non-limiting embodiments in greater detail. The mobile radio site 4 includes two HF combiners 1, 1a, $1_b$ as described for FIGS. 1, 3A, and 3B, for example. It would also be possible for the mobile radio side 4 to include at least one first HF combiner arrangement 3, $3_a$, as described for FIG. 4A, 4B, or 4C.

n base stations $50_a$, $50_b$, ... $50_n$ are provided, the n base station $50_a$, $50_b$ being operable in different mobile radio bands (2100 MHz, 1800 MHz, for example). FIG. 5 shows that different mobile radio standards (UMTS and LTE) may also be used by the base stations $50_a$, $50_b$.

Each of the n base stations $50_a$, $50_b$ has two signal terminals $50_{a1}$, $50_{a2}$, $50_{b1}$, $50_{b2}$, the base stations $50_a$, $50_b$ being designed to transmit and/or receive a MAIN signal at the first signal terminal $50_{a1}$, $50_{b1}$, and the base stations $50_a$, $50_b$ also being designed to transmit and/or receive a DIV signal at the second signal terminal $50_{a2}$, $50_{b2}$.

The first signal terminals $50_{a1}$, $50_{b1}$ of the base station $50_a$, $50_b$ are electrically connected to the signal line terminals $9_1$, $9_2$ of the first HF combiner 1, $1_a$ or of the first HF combiner $1_a$ of the first HF combiner arrangement 3, $3_a$. In contrast, the second signal terminals $50_{a2}$, $50_{b2}$ of the base station $50_a$, $50_b$ are connected to the signal line terminals $9_1$, $9_2$ of the second HF combiner 1, $1_b$ or of the second HF combiner $1_b$ of the first HF combiner arrangement 3, $3_a$.

In addition, a first and a second feeder cable $51_a$, $51_b$ are provided. The first feeder cable $51_a$ at its first end is electrically connected to the common terminal 8 of the first HF combiner 1, 1a or to the common terminal 8 of the first HF combiner $1_a$ of the first HF combiner arrangement 3, $3_a$. The second feeder cable $51_b$ at its first end is electrically connected to the common terminal 8 of the second HF combiner 1, $1_b$ or to the common terminal 8 of the second HF combiner $1_b$ of the first HF combiner arrangement 3, $3_a$.

A second end of the first feeder cable $51_a$ is connected to a first terminal $52_a$ of a dual-band DTMA 52. A second end of the second feeder cable $51_b$ is connected to a second terminal $52_b$ of the dual-band DTMA 52.

In FIG. 5, the first and second HF combiners 1, $1_a$, $1_b$ or the first and second HF combiners $1_a$, $1_b$ of the first HF combiner arrangement 3, $3_a$ are operated in the BTS operating state, since feeding with a DC signal from the respective base station $50_a$, $50_b$ takes place via the corresponding signal line terminal $9_1$, $9_2$.

The base stations $50_a$, $50_b$ at their connections $50_{a1}$, $50_{a2}$, $50_{b1}$, $50_{b2}$ may emit either no signal, a DC signal, an AISG signal, or an AISG+DC signal. Only one AISG signal is output for each base station $50_a$, $50_b$.

The connection of the HF combiners 1, $1_a$, $1_b$ to the respective base station $50_a$, $50_b$ is preferably such that an AISG signal is present in each case only at one signal line terminal $9_1$, $9_2$ of the respective HF combiner 1, $1_a$, $1_b$. This situation is shown in FIG. 5.

The control device 30 determines the presence of an AISG signal and connects the appropriate bypass line $20_1$, $20_2$ from the signal line terminal contact $19_1$, $19_2$ to the common terminal contact 18. As a result, the ASIG signal is also available at the electrical function device 52.

FIG. 6 shows another embodiment of the mobile radio site 4 according to example non-limiting embodiments. In contrast to FIG. 5, n single-band DTMAs $53_1$, $53_2$, not dual-band DTMAs 52, are used. The design, including the connection of the first and the second feeder cable $51_a$, $51_b$ to the first and the second HF combiner 1, $1_a$, $1_b$ or to the first and second HF combiners $1_a$, $1_b$ of the first HF combiner arrangement 3, $3_a$, corresponds to the design as described for FIG. 5.

However, FIG. 6 also shows the use of a third and a fourth HF combiner $1_c$, $1_d$ or a second HF combiner arrangement 3, $3_b$. A common terminal 8 of the HF combiner $1_c$ or a common terminal 8 of the third HF combiner $1_c$ of the second HF combiner arrangement 3, $3_b$ is electrically connected to a second end of the first feeder cable $51_a$. A common terminal 8 of the fourth HF combiner 1, $1_d$ or a common terminal 8 of the fourth HF combiner $1_d$ of the second HF combiner arrangement 3, $3_b$ is electrically connected to a second end of the second feeder cable $51_b$. The third and fourth HF combiners $1_c$, $1_d$ are designed corresponding to FIGS. 1 to 3.

The n signal line terminals $9_1$, $9_2$ of the third HF combiner 1, $1_c$ or the n signal line terminals $9_1$, $9_2$ of the third HF combiner $1_c$ of the second HF combiner arrangement 3, $3_b$ are electrically connected to first terminals $53_{1a}$, $53_{2a}$ of the single-band DTMAs $53_1$, $53_2$. The signal line terminals $9_1$, $9_2$ of the fourth HF combiner 1, $1_d$ or the signal line terminals $9_1$, $9_2$ of the fourth HF combiner $1_d$ of the second HF combiner arrangement 3, $3_b$ are electrically connected to second terminals $53_{1b}$, $53_{2b}$ of the single-band DTMAs $53_1$, $53_2$.

The third and fourth combiners 1, $1_c$, $1_d$ or the third and fourth combiners $1_c$, $1_d$ of the second HF combiner arrangement 3, $3_b$ are operated in the ANT operating state, since the feeding with a DC signal takes place via the respective feeder cable $51_a$, $51_b$ at the common terminal 8.

All four HF combiners 1, $1_a$, $1_b$, $1_c$, $1_d$ preferably have identical designs. During operation, i.e. after the HF combiners are supplied with power, the particular configuration, i.e. the BTS operating state or the ANT operating state, is loaded. Overall, a very flexible approach for mobile radio sites 4 may be provided by use of the universal HF combiner 1 according to example non-limiting embodiments.

FIG. 7 shows another embodiment of the mobile radio site 4 according to example non-limiting embodiments. This mobile radio site essentially corresponds to that from FIG. 6. In contrast, there is only one single-band DTMA $53_1$. This single-band DTMA via its connections $53_{1a}$, $53_{1b}$ is connected to the first signal line terminals $9_1$ of the third and fourth combiners 1, $1_c$, $1_d$. In contrast, antenna elements 54 are directly situated at the second signal line terminals $9_2$ of the third and the fourth combiner 1, $1_c$, $1_d$. In this case, no DC signal can be switched to the second signal line terminals $9_2$ of the third and the fourth combiner 1, $1_c$, $1_d$.

In the following, some particularly significant embodiments are highlighted individually.

In a particular embodiment, the HF combiner 1 includes the following feature:

the control device 30 is designed to establish the electrical connection by controlling the first switching units $32_{1a}$, $32_{2a}$, ..., $32_{na}$ and the second switching units $32_{1b}$, $32_{2b}$, ..., $32_{nb}$ of the respective signal line switching devices $32_1$, $32_2$, ..., $32_n$, as the result of which an AISG signal is transmittable from the common terminal contact 18 to the respective signal line terminal contacts $19_1$, $19_2$, ..., $19_n$.

In a further embodiment, the HF combiner 1 includes the following features:

the detector device includes:
   a) n signal line detector devices $31_1$, $31_2$, ..., $31_n$, wherein each of the n signal line detector devices $31_1$, $31_2$, ..., $31_n$:
      1) is connected or coupled to one of the n signal line terminal contacts $19_1$, $19_2$, ..., $19_n$; or
      2) is connected or coupled between one of the n signal line terminals $9_1$, $9_2$, ..., $9_n$ and one of the n signal line switching devices $32_1$, $32_2$, ..., $32_n$;
   and/or
   b) a common detector device 33 that:
      1) is connected or coupled to the common terminal contact 18; or
      2) is connected or coupled between the common terminal 8 and the n signal line switching devices $32_1$, $32_2$, ..., $32_n$.

In another embodiment, the HF combiner 1 includes the following feature:

the electronics unit 2 is situated on the circuit board arrangement 11.

In an additional embodiment, the HF combiner 1 includes the following feature:

the HF combiner is designed using strip conductor technology.

In a further embodiment, the HF combiner arrangement 3 includes the following features:

the circumferential housing wall 7 of the first HF combiner 1; $1_a$ includes an end-face side 41, a portion of the end-face side 41 that adjoins the receiving space 15 being offset in the direction of the housing base 6, thus forming a first support shoulder 43; and/or the circumferential housing wall 11 of the second HF combiner 1; $1_b$ includes an end-face side 41, a portion of the end-face side 41 that adjoins the receiving space 15 being offset in the direction of the housing base 6, thus forming a second support shoulder 43;

the circuit board $11_a$ of the first HF combiner 1; $1_a$ rests on the first end-face side 43 and/or the circuit board $11_b$ of the second HF combiner 1; $1_b$ rests on the second end-face side 43; or the shared circuit board 11 rests on the second end-face side 43 and/or the shielding cover 42 rests on the first end-face side 43.

In particular embodiment, the mobile radio site 4 includes the following features:

a second end of the first feeder cable $51_a$ is connected to a first terminal $52_a$ of a dual-band DTMA 52;

a second end of the second feeder cable $51_b$ is connected to a second terminal $52_b$ of the dual-band DTMA 52.

In another embodiment, the mobile radio site 4 includes the following features:

a third and a fourth HF combiner 1; $1_c$, $1_d$ or a second HF combiner arrangement 3; $3_b$ are provided;

n single-band DTMAs $53_1$, $53_2$, ..., $53_n$ and/or multiple antenna elements 54 are provided;

a common terminal 8 of the third HF combiner 1; $1_c$ or a common terminal 8 of the third HF combiner 1; $1_c$ of the second HF combiner arrangement 3; $3_b$ is electrically connected to a second end of the first feeder cable $51_a$;

a common terminal 8 of the fourth HF combiner 1; $1_d$ or a common terminal 8 of the fourth HF combiner 1; $1_d$ of the second HF combiner arrangement 3; $3_b$ is electrically connected to a second end of the second feeder cable $51_b$;

the n signal line terminals $9_1$, $9_2$, ..., $9_n$ of the third HF combiner 1; $1_c$ or the n signal line terminals $9_1$, $9_2$, ..., $9_n$ of the third HF combiner 1; $1_c$ of the second HF combiner arrangement 3; $3_b$ are electrically connected to:

a) first terminals $53_{1a}$; $53_{2a}$, ..., $53_{na}$ of the n single-band DTMAs $53_1$, $53_2$, ..., $53_n$; or b) to an antenna element 54 in each case;

the n signal line terminals $9_1$, $9_2$, ..., $9_n$ of the fourth HF combiner 1; $1_d$ or the n signal line terminals $9_1$, $9_2$, ..., $9_n$ of the fourth HF combiner 1; $1_d$ of the second HF combiner arrangement 3, $3_b$ are electrically connected to:

a) second terminals $53_{1b}$; $53_{2b}$, ..., $53_{nb}$ of the n single-band DTMAs $53_1$, $53_2$, ..., $53_d$, or b) to an antenna element 54 in each case The invention is not limited to the described embodiments. Within the scope of the invention, all described and/or illustrated features may be arbitrarily combined with one another.

The invention claimed is:

1. A high-frequency (HF) combiner for use in mobile radio sites, comprising:

at least one housing having a common terminal and n signal line terminals, where n≥2, n≥3, or n≥4, the common terminal and the n signal line terminals being mounted on the housing;

the n signal line terminals being connected and/or coupled to the common terminal within the housing via one of n filter paths in each case;

a circuit board arrangement having a common terminal contact that is galvanically connected to the common terminal;

the circuit board arrangement having n signal line terminal contacts, each of the n signal line terminal contacts being galvanically connected to one of the n signal line terminals;

at least one low-pass filter situated between the common terminal and the common terminal contact and/or at least one low-pass filter situated in each case between at least one or all of the n signal line terminals and the corresponding signal line terminal contact;

the circuit board arrangement including n bypass lines;

each of the n signal line terminal contacts being electrically connected or connectable to the common terminal contact via one of the n bypass lines in each case;

an electronics unit that has a control device, a detector device, and at least n signal line switching devices;

the n signal line switching devices each including at least one first switching unit, the respective at least one first switching unit being situated in each of the n bypass lines;

the detector device being:

a) connected or coupled to the n signal line terminal contacts; or b) connected or coupled between the n signal line terminals and the n signal line switching devices;

the detector device, in a base transceiver station (BTS) operating state, being designed to detect whether an Antenna Interface Standards Group compliant (AISG) signal is present at one of the n signal line terminal contacts;

the control device or the detector device, when an AISG signal is detected at one of the n signal line terminal contacts, being designed to control the first switching unit in the respective one of the n bypass lines in such a way that the first switching unit electrically connects the particular one of the n signal line terminal contacts, at which the AISG signal has been detected, to the common terminal contact.

2. The HF combiner according to claim 1, wherein:

the electrical connection, via which the AISG signal from the particular signal line terminal contact is transmitted to the common terminal contact, is low resistance and/or free from signal converters.

3. The HF combiner according to claim 1, wherein:

the electronics unit has a common signal splitter and n terminal signal splitters;

the common signal splitter and the n terminal signal splitters each including a first, a second, and a third terminal and are designed to:

a) divide a mixed signal that is composed of a direct current (DC) signal and an AISG signal and that is present at the first terminal, and to output the DC signal at the second terminal and output the AISG signal at the third terminal;

b) combine a DC signal that is present at the second terminal, and an AISG signal that is present at the third terminal, and output them as a mixed signal at the first terminal;

the common signal splitter at its first terminal being electrically connected to the common terminal contact;

each of the n terminal signal splitters with its first terminal being electrically connected to one of the n signal line terminal contacts, as the result of which each of the n bypass lines is divided into an AISG line segment and a DC line segment, the DC line segment beginning at the second terminal of the respective terminal signal splitter, and the AISG line segment beginning at the third terminal of the respective terminal signal splitter;

the second terminals of the n terminal signal splitters being electrically connected to one another and to the second terminal of the common signal splitter;

the third terminals of the n terminal signal splitters being electrically connected to one another and to the third terminal of the common signal splitter;

in each case the first switching unit of one of the n signal line switching devices is situated in each AISG line segment.

4. The HF combiner according to claim 3, wherein:
the n signal line switching devices each include at least one second switching unit;
in each case a second switching unit of one of the n signal line switching devices is situated in each DC line segment.

5. The HF combiner according to claim 3, wherein:
the first switching unit of the n signal line switching devices is a relay; and/or
the second switching unit of the n signal line switching devices is a relay.

6. The HF combiner according to claim 1, wherein:
the detector device is also:
 a) connected or coupled to the common terminal contact; or
 b) connected or coupled between the common terminal and the n signal line switching devices;
  the detector device is designed to detect whether a DC signal is present at one of the n signal line terminal contacts;
  the detector device is designed to detect whether a DC signal is present at the common terminal contact;
  the control device is designed to assume a starting operating state upon starting, and from this state:
 a) to change over to the BTS operating state when the detector device detects a DC signal at one of the n signal line terminal contacts; or
 b) to change over to an antenna (ANT) operating state when the detector device detects a DC signal at the common terminal contact.

7. The HF combiner according to claim 6, wherein:
the control device in the BTS operating state is designed to electrically connect the particular one of the n signal line terminal contacts at which a DC signal has first been detected, to the common terminal contact by controlling the corresponding signal line switching device, the control device in the BTS operating state being further designed to electrically disconnect the particular other signal line terminal contacts at which a DC signal has been detected only later or not at all, from the common terminal contact by controlling the corresponding signal line switching devices.

8. The HF combiner according to claim 7, wherein:
the control device in the BTS operating state is designed to control only the second switching unit of the corresponding signal line switching device in order to electrically connect the particular one of the n signal line terminal contacts at which the DC signal has first been detected, to the common terminal contact.

9. The HF combiner according to claim 8, wherein:
the control device in the BTS operating state, for the case that the detector device:
a) detects an AISG signal at one of the n signal line terminal contacts, is designed to control the corresponding signal line switching device in such a way that the latter electrically connects the respective signal line terminal contact to the common terminal contact, so that the AISG signal is present at the common terminal contact; or
b) detects an AISG signal and a DC signal at one of the n signal line terminal contacts, is designed to control the corresponding signal line switching device in such a way that the latter electrically connects the respective signal line terminal contact to the common terminal contact, so that the AISG signal and the DC signal are present at the common terminal contact, the control device being further designed to control the other activated signal line switching devices in such a way that they disconnect an electrical connection between their respective signal line terminal contacts and the common terminal contact.

10. The HF combiner according to claim 9, wherein:
for the case that the detector device detects an AISG signal and a DC signal at one of the n signal line terminal contacts, wherein another signal line terminal contact for transmitting a DC signal is already electrically connected to the common terminal contact, the control device in the BTS operating state is designed to control the corresponding signal line switching device of the particular signal line terminal contact at which the AISG signal and the DC signal have been detected, in such a way that the signal line switching device electrically connects the respective signal line terminal contact to the common terminal contact, so that the AISG signal and the DC signal are present at the common terminal contact, and the previous connection of the other signal line terminal contact to the common terminal contact is electrically disconnected, this changeover taking place without interruption so that a DC signal is always present at the common terminal contact.

11. The HF combiner according to claim 10, wherein:
when the AISG signal is detected, the control device is designed to control the first switching unit of the corresponding signal line switching device, whereas when the AISG signal and the DC signal are detected, the control device is further designed to control the first switching unit and the second switching unit of the corresponding signal line switching device.

12. The HF combiner according to claim 11, wherein:
the detector device is designed to detect whether a short circuit is present at the common terminal contact, the control device being further designed to connect the corresponding signal line terminal contact to the common terminal contact only when no short circuit has been detected by the detector device.

13. The HF combiner according to claim 12, wherein:
the control device in the starting operating state is designed to control the n signal line switching devices in such a way that they disconnect the n bypass lines, as the result of which the n signal line terminal contacts are electrically disconnected from the common terminal contact.

14. The HF combiner according to claim 6, wherein:
the detector device is designed to detect a short circuit at the n signal line terminal contacts, the control device in the ANT operating state being designed to electrically connect the common terminal contact only to the particular one of the n signal line terminal contacts at which no short circuit has been detected, by controlling the corresponding signal line switching devices.

15. The HF combiner according to claim 14, wherein:
the control device in the BTS operating state or in the ANT operating state is designed to control the n signal line switching devices in such a way that they electrically disconnect the signal line terminal contacts from the common terminal contact when a level of the DC signals at the n signal line terminal contacts and the common terminal contact drops below a settable threshold value.

16. The HF combiner according to claim 1, wherein:
the control device in the BTS operating state, when an AISG signal is detected at one of the n signal line terminal contacts by the detector device, is designed to control the first switching unit of the corresponding signal line switching device in a time period that the first on/off keying pulse of the AISG signal, designed as an on/off keying signal, is transmittable by more than 70%, 80%, or 90% to the common terminal contact.

17. The HF combiner arrangement, having a first and a second HF combiner which are designed according to claim 1, wherein the first and the second HF combiner also include:
the housing has a cavity design, and includes a housing base, the circuit board arrangement spaced apart from the housing base, and a circumferential housing wall between the housing base and the circuit board arrangement, thus delimiting a receiving space;
in each filter path, at least one resonator inner conductor is provided that is galvanically connected to the housing base of the housing and extends in the axial direction from the housing base in the direction of the circuit board arrangement, and ends at a distance from the circuit board arrangement and/or is galvanically separated from same;
the individual filter paths in which at least one resonator inner conductor is situated in each case are separated, at least partially, from one another by a wall that is galvanically connected to the housing base and extends in the direction of the circuit board arrangement;
and wherein the HF combiner arrangement includes the following feature:
the first and the second HF combiner are placed one on top of the other, the circuit board arrangement electrically and/or electromagnetically separating the receiving space of the first HF combiner from the receiving space of the second HF combiner, and conversely.

18. The HF combiner arrangement according to claim 17, wherein:
the circuit board arrangements of the first and the second HF combiner each include a circuit board, the particular electronics unit of the first and the second HF combiner being situated only on a first side of the respective circuit board, these first sides of the circuit boards having the electronics unit being oppositely situated, and a second side of the respective circuit board being coated with a metal layer.

19. The HF combiner arrangement according to claim 18, wherein:
the circuit board arrangement of the first and the second HF combiner has a shared circuit board;
the electronics unit of the first HF combiner and the electronics unit of the second HF combiner are situated on a first side of this shared circuit board;
the shared circuit board includes the common terminal contacts and the signal line terminal contacts of the first and the second HF combiner;
a shielding cover is also situated between the first side of the shared circuit board and the first HF combiner, so that the first side of the shared circuit board is electrically and/or electromagnetically separated from the receiving space of the first HF combiner;
the second side of the shared circuit board is coated with a metal layer, so that the first side of the shared circuit board is electrically or electromagnetically separated from the receiving space of the second HF combiner; and/or
a further shielding cover is provided between the second side of the shared circuit board and the second HF combiner, so that the first side of the shared circuit board is electrically and/or electromagnetically separated from the receiving space of the second HF combiner.

20. A mobile radio site having at least two HF combiners according to claim 1 wherein:
n base stations are provided, the n base stations being operable in different mobile radio bands;
each of the n base stations has two signal terminals, the n base stations being designed for transmitting and/or receiving preferably a MAIN signal at a first signal terminal, and the n base stations being designed for transmitting and/or receiving a diversity (DIV) signal at a second signal terminal;
the first signal terminals of the n base stations are electrically connected to the n signal line terminals of the first HF combiner or of the first HF combiner of the first HF combiner arrangement;
the second signal terminals of the n base stations are electrically connected to the n signal line terminals of the second HF combiner or of the second HF combiner of the first HF combiner arrangement;
a first and a second feeder cable are provided;
the first feeder cable with its first end is electrically connected to the common terminal of the first HF combiner or to the common terminal of the first HF combiner of the first HF combiner arrangement;
the second feeder cable with its first end is electrically connected to the common terminal of the second HF combiner or to the common terminal of the second HF combiner of the first HF combiner arrangement.

* * * * *